(12) United States Patent
Swaminathan et al.

(10) Patent No.: US 9,355,886 B2
(45) Date of Patent: May 31, 2016

(54) CONFORMAL FILM DEPOSITION FOR GAPFILL

(71) Applicant: Novellus Systems, Inc., Fremont, CA (US)

(72) Inventors: Shankar Swaminathan, Hillsboro, OR (US); Bart van Schravendijk, Cupertino, CA (US); Adrien LaVoie, Newberg, OR (US); Sesha Varadarajan, Lake Oswego, OR (US); Jason Daejin Park, San Jose, CA (US); Michal Danek, Cupertino, CA (US); Naohiro Shoda, Los Gatos, CA (US)

(73) Assignee: Novellus Systems, Inc., Fremont, CA (US)

( * ) Notice: Subject to any disclaimer, the term of this patent is extended or adjusted under 35 U.S.C. 154(b) by 167 days.

(21) Appl. No.: 14/074,596

(22) Filed: Nov. 7, 2013

(65) Prior Publication Data

US 2014/0134827 A1 May 15, 2014

Related U.S. Application Data

(63) Continuation-in-part of application No. 13/084,399, filed on Apr. 11, 2011, now Pat. No. 8,728,956.

(60) Provisional application No. 61/724,186, filed on Nov. 8, 2012, provisional application No. 61/324,710, filed (Continued)

(51) Int. Cl.
*H01L 21/311* (2006.01)
*H01L 21/762* (2006.01)

(Continued)

(52) U.S. Cl.
CPC ........ *H01L 21/76224* (2013.01); *C23C 16/045* (2013.01); *C23C 16/45523* (2013.01);

(Continued)

(58) Field of Classification Search
CPC ................................................ H01L 21/31116
USPC ......................................... 438/702, 710, 715
See application file for complete search history.

(56) References Cited

U.S. PATENT DOCUMENTS

| 4,500,563 A | 2/1985 | Ellenberger et al. |
| 5,496,608 A | 3/1996 | Matsuda et al. |

(Continued)

FOREIGN PATENT DOCUMENTS

| EP | 2 278 046 | 1/2011 |
| JP | 4364320 | 8/2009 |

(Continued)

OTHER PUBLICATIONS

U.S. Appl. No. 13/963,212, filed Aug. 9, 2013, entitled "Plasma-Activated Deposition of Conformal Films".

(Continued)

*Primary Examiner* — Bradley K Smith
(74) *Attorney, Agent, or Firm* — Weaver Austin Villeneuve & Sampson LLP

(57) ABSTRACT

A method and apparatus for conformally depositing a dielectric oxide in high aspect ratio gaps in a substrate is disclosed. A substrate is provided with one or more gaps into a reaction chamber where each gap has a depth to width aspect ratio of greater than about 5:1. A first dielectric oxide layer is deposited in the one or more gaps by CFD. A portion of the first dielectric oxide layer is etched using a plasma etch, where etching the portion of the first dielectric oxide layer occurs at a faster rate near a top surface than near a bottom surface of each gap so that the first dielectric oxide layer has a tapered profile from the top surface to the bottom surface of each gap. A second dielectric oxide layer is deposited in the one or more gaps over the first dielectric oxide layer via CFD.

14 Claims, 10 Drawing Sheets

Related U.S. Application Data on Apr. 15, 2010, provisional application No. 61/372,367, filed on Aug. 10, 2010, provisional application No. 61/379,081, filed on Sep. 1, 2010, provisional application No. 61/417,807, filed on Nov. 29, 2010.

(51) Int. Cl.
| | |
|---|---|
| *H01L 21/67* | (2006.01) |
| *H01L 21/02* | (2006.01) |
| *C23C 16/04* | (2006.01) |
| *C23C 16/455* | (2006.01) |
| *C23C 16/56* | (2006.01) |

(52) U.S. Cl.
CPC ............ *C23C16/56* (2013.01); *H01L 21/0228* (2013.01); *H01L 21/02126* (2013.01); *H01L 21/02164* (2013.01); *H01L 21/02274* (2013.01); *H01L 21/67017* (2013.01)

(56) References Cited

U.S. PATENT DOCUMENTS

| | | | |
|---|---|---|---|
| 5,670,432 A | 9/1997 | Tsai | |
| 5,856,003 A | 1/1999 | Chiu | |
| 5,874,368 A | 2/1999 | Laxman et al. | |
| 5,932,286 A | 8/1999 | Beinglass et al. | |
| 6,270,572 B1 | 8/2001 | Kim et al. | |
| 6,391,803 B1 | 5/2002 | Kim et al. | |
| 6,428,859 B1 | 8/2002 | Chiang et al. | |
| 6,468,924 B2 | 10/2002 | Lee et al. | |
| 6,528,430 B2 | 3/2003 | Kwan et al. | |
| 6,551,893 B1 | 4/2003 | Zheng et al. | |
| 6,576,053 B1 | 6/2003 | Kim et al. | |
| 6,632,478 B2 | 10/2003 | Gaillard et al. | |
| 6,645,574 B1 | 11/2003 | Lee et al. | |
| 6,689,220 B1 | 2/2004 | Nguyen | |
| 6,723,595 B2 | 4/2004 | Park | |
| 6,730,614 B1 | 5/2004 | Lim et al. | |
| 6,743,738 B2 | 6/2004 | Todd | |
| 6,756,318 B2 | 6/2004 | Nguyen et al. | |
| 6,809,421 B1 | 10/2004 | Hayasaka et al. | |
| 6,828,218 B2 | 12/2004 | Kim et al. | |
| 6,835,417 B2 | 12/2004 | Saenger et al. | |
| 6,861,356 B2 | 3/2005 | Matsuse et al. | |
| 6,884,466 B2 | 4/2005 | Kaloyeros et al. | |
| 6,930,058 B2 | 8/2005 | Hill et al. | |
| 6,930,060 B2 | 8/2005 | Chou et al. | |
| 6,943,092 B2 | 9/2005 | Kim et al. | |
| 6,962,876 B2 | 11/2005 | Ahn et al. | |
| 6,987,240 B2 | 1/2006 | Jennings et al. | |
| 7,001,844 B2 | 2/2006 | Chakravarti et al. | |
| 7,041,335 B2 | 5/2006 | Chung | |
| 7,077,904 B2 | 7/2006 | Cho et al. | |
| 7,081,271 B2 | 7/2006 | Chung et al. | |
| 7,109,129 B1 | 9/2006 | Papasouliotis | |
| 7,115,528 B2 | 10/2006 | Vaartstra et al. | |
| 7,122,222 B2 | 10/2006 | Xiao et al. | |
| 7,122,464 B2 | 10/2006 | Vaarstra | |
| 7,125,815 B2 | 10/2006 | Vaartstra | |
| 7,132,353 B1 | 11/2006 | Xia et al. | |
| 7,148,155 B1 | 12/2006 | Tarafdar et al. | |
| 7,151,039 B2 | 12/2006 | Lee et al. | |
| 7,172,792 B2 | 2/2007 | Wang et al. | |
| 7,176,084 B2 | 2/2007 | Lee et al. | |
| 7,205,187 B2 | 4/2007 | Leith et al. | |
| 7,223,649 B2 | 5/2007 | Oh et al. | |
| 7,241,686 B2 | 7/2007 | Marcadal et al. | |
| 7,244,668 B2 | 7/2007 | Kim | |
| 7,250,083 B2 | 7/2007 | Sneh | |
| 7,259,050 B2 | 8/2007 | Chen et al. | |
| 7,261,919 B2 | 8/2007 | Mehregany et al. | |
| 7,294,582 B2 | 11/2007 | Haverkort et al. | |
| 7,297,641 B2 | 11/2007 | Todd et al. | |
| 7,300,885 B2 | 11/2007 | Hasebe et al. | |
| 7,314,835 B2 | 1/2008 | Ishizaka et al. | |
| 7,341,959 B2 | 3/2008 | Brcka | |
| 7,351,668 B2 | 4/2008 | Chou et al. | |
| 7,361,538 B2 | 4/2008 | Luan et al. | |
| 7,361,611 B2 | 4/2008 | Chakravarti et al. | |
| 7,390,743 B2 | 6/2008 | Shin | |
| 7,393,561 B2 | 7/2008 | Paranjpe | |
| 7,399,388 B2 | 7/2008 | Moghadam et al. | |
| 7,419,888 B2 | 9/2008 | Yang et al. | |
| 7,435,454 B2 | 10/2008 | Brcka | |
| 7,435,684 B1 | 10/2008 | Lang et al. | |
| 7,462,571 B2 | 12/2008 | Hasebe et al. | |
| 7,482,247 B1 | 1/2009 | Papasouliotis et al. | |
| 7,488,694 B2 | 2/2009 | Kim et al. | |
| 7,507,676 B2 | 3/2009 | Chou et al. | |
| 7,510,984 B2 | 3/2009 | Saito et al. | |
| 7,521,331 B2 | 4/2009 | Park et al. | |
| 7,524,762 B2 | 4/2009 | Marcadal et al. | |
| 7,544,615 B2 | 6/2009 | Vaartstra | |
| 7,572,052 B2 | 8/2009 | Ravi et al. | |
| 7,592,231 B2 | 9/2009 | Cheng et al. | |
| 7,595,010 B2 | 9/2009 | Chakravarti et al. | |
| 7,601,648 B2 | 10/2009 | Chua et al. | |
| 7,615,438 B2 | 11/2009 | Ahn et al. | |
| 7,615,449 B2 | 11/2009 | Chung et al. | |
| 7,622,369 B1 | 11/2009 | Lee et al. | |
| 7,622,383 B2 | 11/2009 | Kim et al. | |
| 7,629,267 B2 | 12/2009 | Wan et al. | |
| 7,632,757 B2 | 12/2009 | Matsuura | |
| 7,633,125 B2 | 12/2009 | Lu et al. | |
| 7,638,170 B2 | 12/2009 | Li | |
| 7,645,484 B2 | 1/2010 | Ishizaka | |
| 7,651,729 B2 | 1/2010 | Kim et al. | |
| 7,651,730 B2 | 1/2010 | Hasebe | |
| 7,651,953 B2 | 1/2010 | Todd et al. | |
| 7,651,959 B2 | 1/2010 | Fukazawa et al. | |
| 7,682,657 B2 | 3/2010 | Sherman | |
| 7,713,592 B2 | 5/2010 | Nguyen et al. | |
| 7,758,920 B2 | 7/2010 | Hasebe et al. | |
| 7,776,733 B2 | 8/2010 | Hasegawa | |
| 7,825,039 B2 | 11/2010 | Takahashi et al. | |
| 7,906,168 B2 | 3/2011 | Hasebe et al. | |
| 7,919,416 B2 | 4/2011 | Lee et al. | |
| 7,923,068 B2 | 4/2011 | Dickey et al. | |
| 7,923,378 B2 | 4/2011 | Hasebe et al. | |
| 7,959,985 B2 | 6/2011 | Ishizaka et al. | |
| 7,964,241 B2 | 6/2011 | Hasebe et al. | |
| 7,964,513 B2 | 6/2011 | Todd et al. | |
| 7,981,473 B2 | 7/2011 | Kim et al. | |
| 7,989,365 B2 | 8/2011 | Park et al. | |
| 8,034,673 B2 | 10/2011 | Kadonaga et al. | |
| 8,080,290 B2 | 12/2011 | Hasebe et al. | |
| 8,101,531 B1 | 1/2012 | Li et al. | |
| 8,119,544 B2 | 2/2012 | Hasebe et al. | |
| 8,133,797 B2 | 3/2012 | van Schravendijk et al. | |
| 8,178,448 B2 | 5/2012 | Nodera et al. | |
| 8,227,032 B2 | 7/2012 | Dussarrat et al. | |
| 8,257,789 B2 | 9/2012 | Matsunaga et al. | |
| 8,278,224 B1 | 10/2012 | Mui et al. | |
| 8,334,218 B2 | 12/2012 | Van Nooten et al. | |
| 8,357,619 B2 | 1/2013 | Hasebe et al. | |
| 8,366,953 B2 | 2/2013 | Kohno et al. | |
| 8,383,525 B2 | 2/2013 | Raisanen et al. | |
| 8,394,466 B2 | 3/2013 | Hong et al. | |
| 8,524,612 B2 | 9/2013 | Li et al. | |
| 8,592,328 B2 | 11/2013 | Hausmann et al. | |
| 8,637,411 B2 | 1/2014 | Swaminathan et al. | |
| 8,647,993 B2 | 2/2014 | Lavoie et al. | |
| 8,728,956 B2 | 5/2014 | LaVoie et al. | |
| 8,956,983 B2 | 2/2015 | Swaminathan et al. | |
| 2002/0076507 A1 | 6/2002 | Chiang et al. | |
| 2003/0008070 A1 | 1/2003 | Seutter et al. | |
| 2003/0024477 A1 | 2/2003 | Okuda et al. | |
| 2004/0033698 A1 | 2/2004 | Lee et al. | |
| 2004/0053515 A1 | 3/2004 | Comita et al. | |
| 2004/0231799 A1 | 11/2004 | Lee et al. | |
| 2005/0042865 A1 | 2/2005 | Cabral et al. | |
| 2005/0109276 A1 | 5/2005 | Iyer et al. | |
| 2005/0118837 A1 | 6/2005 | Todd et al. | |
| 2005/0159017 A1 | 7/2005 | Kim et al. | |

(56) References Cited

U.S. PATENT DOCUMENTS

| | | |
|---|---|---|
| 2005/0181535 A1 | 8/2005 | Yun et al. |
| 2005/0196977 A1 | 9/2005 | Saito et al. |
| 2005/0233553 A1 | 10/2005 | Kountz et al. |
| 2005/0260347 A1 | 11/2005 | Narwankar et al. |
| 2005/0287775 A1 | 12/2005 | Hasebe et al. |
| 2006/0030148 A1 | 2/2006 | Seutter et al. |
| 2006/0084283 A1 | 4/2006 | Paranjpe et al. |
| 2006/0088985 A1 | 4/2006 | Haverkort et al. |
| 2006/0165890 A1 | 7/2006 | Kaushal et al. |
| 2006/0199357 A1 | 9/2006 | Wan et al. |
| 2006/0286774 A1 | 12/2006 | Singh et al. |
| 2006/0286776 A1 | 12/2006 | Ranish et al. |
| 2006/0286818 A1 | 12/2006 | Wang et al. |
| 2007/0010071 A1 | 1/2007 | Matsuura |
| 2007/0065576 A1 | 3/2007 | Singh et al. |
| 2007/0137572 A1 | 6/2007 | Matsuura et al. |
| 2007/0167028 A1 | 7/2007 | Chou et al. |
| 2007/0215036 A1 | 9/2007 | Park et al. |
| 2007/0218701 A1 | 9/2007 | Shimizu et al. |
| 2007/0232082 A1 | 10/2007 | Balseanu et al. |
| 2007/0251444 A1 | 11/2007 | Gros et al. |
| 2007/0259110 A1 | 11/2007 | Mahajani et al. |
| 2008/0038936 A1 | 2/2008 | Todd et al. |
| 2008/0063791 A1 | 3/2008 | Hasebe et al. |
| 2008/0075881 A1 | 3/2008 | Won et al. |
| 2008/0131601 A1 | 6/2008 | Kim et al. |
| 2008/0139003 A1 | 6/2008 | Pirzada et al. |
| 2008/0213479 A1 | 9/2008 | Chou et al. |
| 2008/0242116 A1 | 10/2008 | Clark |
| 2008/0274302 A1 | 11/2008 | Hasebe et al. |
| 2008/0311760 A1 | 12/2008 | Nodera et al. |
| 2008/0317972 A1 | 12/2008 | Hendriks et al. |
| 2009/0018668 A1 | 1/2009 | Galbraith |
| 2009/0039349 A1 | 2/2009 | Honda |
| 2009/0041952 A1 | 2/2009 | Yoon et al. |
| 2009/0065896 A1 | 3/2009 | Hwang et al. |
| 2009/0075490 A1 | 3/2009 | Dussarrat |
| 2009/0148625 A1 | 6/2009 | Yeom et al. |
| 2009/0155606 A1 | 6/2009 | Yoon et al. |
| 2009/0163012 A1 | 6/2009 | Clark et al. |
| 2009/0191722 A1 | 7/2009 | Hasebe et al. |
| 2009/0203197 A1 | 8/2009 | Hanawa et al. |
| 2009/0208880 A1 | 8/2009 | Nemani et al. |
| 2009/0278224 A1 | 11/2009 | Kim et al. |
| 2010/0022099 A1 | 1/2010 | Van Nooten et al. |
| 2010/0025824 A1 | 2/2010 | Chen et al. |
| 2010/0096688 A1 | 4/2010 | Balseanu et al. |
| 2010/0102417 A1 | 4/2010 | Ganguli et al. |
| 2010/0124621 A1 | 5/2010 | Kobayashi et al. |
| 2010/0136260 A1 | 6/2010 | Matsunaga et al. |
| 2010/0136313 A1 | 6/2010 | Shimizu et al. |
| 2010/0221925 A1 | 9/2010 | Lee et al. |
| 2010/0304574 A1 | 12/2010 | Nodera et al. |
| 2010/0310791 A1 | 12/2010 | Shimazu et al. |
| 2011/0003445 A1 | 1/2011 | Murata et al. |
| 2011/0014795 A1 | 1/2011 | Lee et al. |
| 2011/0014796 A1 | 1/2011 | Hayashi |
| 2011/0014798 A1 | 1/2011 | Mallick et al. |
| 2011/0086516 A1 | 4/2011 | Lee et al. |
| 2011/0151142 A1 | 6/2011 | Seamons et al. |
| 2011/0151674 A1* | 6/2011 | Tang et al. .................... 438/715 |
| 2011/0159202 A1 | 6/2011 | Matsushita et al. |
| 2011/0198756 A1 | 8/2011 | Thenappan et al. |
| 2011/0215445 A1 | 9/2011 | Yang et al. |
| 2011/0256726 A1* | 10/2011 | LaVoie et al. ................. 438/702 |
| 2011/0256734 A1 | 10/2011 | Hausmann et al. |
| 2011/0298099 A1 | 12/2011 | Lee et al. |
| 2012/0009802 A1 | 1/2012 | LaVoie et al. |
| 2012/0009803 A1 | 1/2012 | Jung et al. |
| 2012/0028454 A1 | 2/2012 | Swaminathan et al. |
| 2012/0028469 A1 | 2/2012 | Onizawa et al. |
| 2012/0058282 A1 | 3/2012 | Hong et al. |
| 2012/0077349 A1 | 3/2012 | Li et al. |
| 2012/0108079 A1 | 5/2012 | Mahajani |
| 2012/0164846 A1 | 6/2012 | Ha et al. |
| 2012/0213940 A1 | 8/2012 | Mallick |
| 2012/0282418 A1 | 11/2012 | Chou et al. |
| 2012/0315394 A1 | 12/2012 | Ito |
| 2013/0040447 A1 | 2/2013 | Swaminathan et al. |
| 2013/0071580 A1 | 3/2013 | Weidman et al. |
| 2013/0115783 A1 | 5/2013 | Kim et al. |
| 2013/0189854 A1 | 7/2013 | Hausmann et al. |
| 2013/0196516 A1 | 8/2013 | Lavoie et al. |
| 2013/0309415 A1 | 11/2013 | Swaminathan et al. |
| 2013/0319329 A1 | 12/2013 | Li et al. |
| 2014/0030444 A1 | 1/2014 | Swaminathan et al. |
| 2014/0051262 A9 | 2/2014 | Lavoie et al. |
| 2014/0106574 A1 | 4/2014 | Kang et al. |
| 2014/0113457 A1 | 4/2014 | Sims et al. |
| 2014/0120737 A1 | 5/2014 | Swaminathan et al. |
| 2014/0141542 A1 | 5/2014 | Kang et al. |
| 2014/0141626 A1 | 5/2014 | Hausmann et al. |
| 2014/0209562 A1 | 7/2014 | LaVoie et al. |
| 2014/0216337 A1 | 8/2014 | Swaminathan et al. |

FOREIGN PATENT DOCUMENTS

| | | |
|---|---|---|
| JP | 2010-10497 | 1/2010 |
| KR | 10-2001-0111448 | 12/2001 |
| KR | 10-2004-0001036 | 1/2004 |
| KR | 10-2009-0057665 | 6/2009 |
| KR | 10-2009-0080019 | 7/2009 |
| KR | 10-2009-0081396 | 7/2009 |
| WO | WO 2006/026350 | 3/2006 |
| WO | 2007/118026 | 10/2007 |
| WO | 2011/130326 | 10/2011 |
| WO | 2011/130397 | 10/2011 |
| WO | 2012/040317 | 3/2012 |
| WO | WO 2012/048094 | 4/2012 |
| WO | 2012/087737 | 6/2012 |
| WO | 2013/032786 | 3/2013 |
| WO | 2013/043330 | 3/2013 |
| WO | 2013/112727 | 8/2013 |

OTHER PUBLICATIONS

U.S. Appl. No. 14/065,334, filed Oct. 28, 2013, entitled "Method for Depositing a Cholrine-Free Conformal Sin Film".

U.S. Appl. No. 13/953,616, filed Jul. 29, 2013, entitled "High Pressure, High Power Plasma Activated Conformal Film Deposition".

U.S. Appl. No. 14/061,587, filed Oct. 23, 2013, entitled "Sub-Saturated Atomic Layer Deposition and Conformal Film Deposition".

US Office Action dated Mar. 15, 2013 issued in U.S. Appl. No. 13/084,399.

US Final Office Action dated Sep. 13, 2013 issued in U.S. Appl. No. 13/084,399.

US Office Action dated Sep. 14, 2012 issued in U.S. Appl. No. 13/084,305.

US Final Office Action dated Apr. 25, 2013 issued in U.S. Appl. No. 13/084,305.

US Office Action dated Apr. 13, 2011 issued in U.S. Appl. No. 12/889,132.

US Notice of Allowance dated Sep. 30, 2011 issued in U.S. Appl. No. 12/889,132.

US Office Action dated Aug. 1, 2012 issued in U.S. Appl. No. 13/011,569.

US Final Office Action dated Feb. 26, 2013 issued in U.S. Appl. No. 13/011,569.

US Notice of Allowance dated May 6, 2013 issued in U.S. Appl. No. 13/011,569.

US Ofiice Action dated Apr. 4, 2013 issued U.S. Appl. No. 13/242,084.

US Notice of Allowance dated Jun. 19, 2013 issued in U.S. Appl. No. 13/242,084.

US Notice of Allowance dated Sep. 19, 2013 issued in U.S. Appl. No. 13/242,084.

US Office Action dated Apr. 29, 2013 issued U.S. Appl. No. 13/224,240.

US Office Action dated Jun. 7, 2013 issued U.S. Appl. No. 13/414,619.

(56) References Cited

OTHER PUBLICATIONS

US Notice of Allowance dated Jul. 26, 2013, issued U.S. Appl. No. 13/414,619.
US Office Action dated May 24, 2013 issued U.S. Appl. No. 13/472,282.
US Notice of Allowance dated Oct. 4, 2013 issued U.S. Appl. No. 13/472,282.
PCT International Search Report and Written Opinion, dated Oct. 20, 2011, issued in PCT/US2011/032186.
PCT International Preliminary Report on Patentability dated Oct. 26, 2012, issued in PCT/US2011/032186.
PCT Invitation to Pay Additional Fees; Communication Re Partial International Search, dated Dec. 16, 2011, issued in PCT/US2011/032303.
PCT International Search Report and Written Opinion, dated Feb. 20, 2012, issued in PCT/US2011/032303.
PCT International Preliminary Report on Patentability and Written Opinion, dated Oct. 26, 2012, issued in PCT/US2011/032303.
PCT International Search Report and Written Opinion dated May 2, 2012 issued in Application No. PCT/US2011/052537.
PCT International Preliminary Report on Patentability and Written Opinion dated Apr. 4, 2013 issued in Application No. PCT/US2011/052537.
PCT International Search Report and Written Opinion dated Dec. 18, 2012, issued in Application No. PCT/US2012/052769.
PCT International Search Report and Written Opinion dated Feb. 28, 2013, issued in Application No. PCT/US2012/051740.
PCT International Search Report and Written Opinion dated May 27, 2013, issued in Application No. PCT/US2013/022977.
Cecchi et al., (2007) "Ultra-thin conformal pore-sealing of low-k materials by plasma-assisted ALD," University of New Mexico, Albuquerque, NM, Sandia National Labs, Albuquerque, NM, 1 page.
Choi, Gyu-Jin et al., (2009) "Plasma-enhanced atomic layer deposition of $TiO_2$ and Al-doped $TiO_2$ films using $N_2O$ and $O_2$ reactants," *Journal of the Electrochemical Society*, 156(9):G138-G143.
King, Sean W., (Jul./Aug. 2011) "Plasma enhanced atomic layer deposition of $SiN_x$:H and $SiO_2$," *J. Vac. Sci. Technol.* A29(4):9 pages.
Lee et al., (2005) "Chemically conformal deposition of $SrTiO_3$ thin films by Atomic Layer Deposition using conventional metal organic precursors and remote-plasma activated $H_2O$," School of Materials Science and Engineering, and Inter-university Semiconductor Research Center, Seoul National University, *Microelectronic Engineering* 80:158-161.
Lee, Jong Ju, (2005) "Low-impurity, highly conformal atomic layer deposition of titanium nitride using $NH_3$—Ar—$H_2$ plasma treatment for capacitor electrodes," *Materials Letters*, 59:615-617.
Man P.F. et al., (Feb. 11-15, 1996) "Elimination of Post-Release Adhesion in Microstructures Using Conformal Fluorocarbon Coatings," *MEMS '96 Proceedings, IEEE*, pp. 55-60.
Nguyen, S.V. et al., (Jan./Mar. 1999) "Plasma-assist chemical vapor deposition of dielectric thin films for ULSI semiconductor circuits," *IBM J.Res.Develop.* 43(1.2):5-38.
Plasma Enhanced Atomic Layer Deposition (PEALD), Website: http://www.asm.com/index.php?option=com_content&task=view &id=19&Itemid=161 (2010), 1 page.
PlasmaPro™, NGP® 80 Range, Next Generation Plasma Systems, *Oxford Instruments* (2010), 8 pages.
U.S. Appl. No. 14/194,549, filed Feb. 28, 2014, entitled "Capped ALD Films for Doping FIN-Shaped Channel Regions of 3-D IC Transistors."
U.S. Appl. No. 14/183,287, filed Feb. 18, 2014, entitled "High Growth Rate Process for Conformal Aluminum Nitride."
"U.S. Appl. No. 14/187,145, filed Feb. 21, 2014, entitled "Plasma Assisted Atomic Layer Deposition Titanium Oxide for Conformal Encapsulation and Gap Fill Applications.""
"U.S. Appl. No. 14/195,653, filed Mar. 3, 2014, entitled "RF Cycle Purging to Reduce Surface Roughness in Metal Oxide and Metal Nitride Films.""
U.S. Appl. No. 14/194,324, filed Feb. 28, 2014, entitled "Soft Landing Nanolaminates for Advanced Patterning."

US Notice of Allowance dated Jan. 15, 2014 issued in U.S. Appl. No. 13/084,399.
US Office Action dated Jan. 2, 2015 issued in U.S. Appl. No. 14/231,554.
US Notice of Allowance dated Aug. 7, 2014 issued U.S. Appl. No. 14/133,239.
US Notice of Allowance dated Nov. 26, 2014 issued U.S. Appl. No. 14/133,239.
US Final Office Action dated Nov. 22, 2013 issued U.S. Appl. No. 13/224,240.
US Examiner's Answer to Appeal Brief (filed May 22, 2014) Before the Patent Trial and Appeal Board dated Aug. 14, 2014 issued U.S. Appl. No. 13/224,240.
US Office Action dated May 21, 2014 issued in Application No. 13/607,386.
US Notice of Allowance dated Oct. 8, 2014 issued in U.S. Appl. No. 13/607,386.
US Notice of Allowance dated Nov. 19, 2014 issued in U.S. Appl. No. 13/607,386.
US Office Action dated Jun. 13, 2014 issued in U.S. Appl. No. 13/953,616.
US Final Office Action dated Nov. 24, 2014 issued in U.S. Appl. No. 13/953,616.
US Office Action dated Mar. 2, 2015 issued in U.S. Appl. No. 14/137,860.
US Office Action dated Jul. 10, 2014 issued in U.S. Appl. No. 14/144,107.
US Final Office Action dated Jan. 15, 2015 issued in U.S. Appl. No. 14/144,107.
PCT International Preliminary Report on Patentability and Written Opinion dated Apr. 3, 2014, issued in Application No. PCT/US2012/052769.
PCT International Preliminary Report on Patentability and Written Opinion dated Mar. 13, 2014, issued in Application No. PCT/US2012/051740.
European Extended Search Report dated Apr. 14, 2014 issued in EP 13 15 2046.
Korean Notice of Provisional Rejection dated Dec. 6, 2013 issued in KR 10-2012-0043797.
Korean Final Office Action dated Aug. 18, 2014 issued in KR 10-2012-0043797.
PCT International Preliminary Report on Patentability and Written Opinion dated Aug. 7, 2014, issued in Application No. PCT/US2013/022977.
Hausmann et al. (2002) "Atomic Layer Deposition of Hafnium and Zirconium Oxides Using Metal Amide Precursors," Chem. Mater. 14(10):4350-4358.
Kim, H., et al. (2002) "The Growth of Tantalum Thin Films by Plasma-Enhanced Atomic Layer Deposition and Diffusion Barrier Properties," Mat. Res. Soc. Symp. Proc. 716:B8.5.1-B8.5.6.
Ko, Myoung-Gyun, et al., "Characterization of ruthenium thin film deposited by rf-direct plasma atomic layer deposition," 209th ECS Meeting, Abstract #50, p. 1 [Downloaded on Jun. 9, 2014].
Ko, Myoung-Gyun, et al., (Oct. 2008) "Correlation of Carbon Content with the Thermal Stability of Ruthenium Deposited by Using RF-Direct Plasma-Enhanced Atomic-Layer Deposition," Journal of the Korean Physical Society, 53(4):2123-2128.
Li, Xingcun, et al., (2011) "Atomic Layer Deposition A1203 Thin Films in Magnetized Radio Frequency Plasma Source," Physics Procedia 18:100-106.
Puurunen, Riikka L. (2005) "Surface chemistry of atomic layer deposition: A case study for the trimethylaluminum/water process," Journal of Applied Physics, 97:121301-1—121301-52.
van der Straten et al. (2004) "Atomic layer deposition of tantalum nitride for ultrathin liner applications in advanced copper metallization schemes," Journal of Materials Research, 19(2):447-453.

* cited by examiner

CONFORMAL FILM DEPOSITION FOR GAPFILL

CROSS-REFERENCE TO RELATED APPLICATIONS

This application claims the benefit of U.S. Provisional Patent Application No. 61/724,186, filed Nov. 8, 2012, and titled "CONFORMAL FILM DEPOSITION FOR GAPFILL," which is incorporated by reference herein in its entirety and for all purposes. This application also claims priority as a continuation-in-part of U.S. application Ser. No. 13/084,399, filed Apr. 11, 2011 and titled "PLASMA ACTIVATED CONFORMAL FILM DEPOSITION," which claims the benefit of U.S. Provisional Patent Application No. 61/324,710, filed Apr. 15, 2010 and titled "PLASMA ACTIVATED CONFORMAL FILM DEPOSITION," and U.S. Provisional Patent Application No. 61/372,367, filed Aug. 10, 2010 and titled "PLASMA ACTIVATED CONFORMAL FILM DEPOSITION," and U.S. Provisional Patent Application No. 61/379,081, filed Sep. 1, 2010 and titled "PLASMA ACTIVATED CONFORMAL FILM DEPOSITION," and U.S. Provisional Patent Application No. 61/417,807, filed Nov. 29, 2010 and titled "PLASMA ACTIVATED CONFORMAL FILM DEPOSITION," each of which is hereby incorporated by reference herein in its entirety and for all purposes.

INTRODUCTION

1. Field of the Invention

This disclosure generally relates to formation of conformal dielectric thin films in structures of confined geometry such as high aspect ratio gaps. More specifically, this disclosure pertains to conformal film deposition (CFD) of highly conformal dielectric thin films for gap fill.

2. Background

Layers of dielectric film are used in several applications in sub-micron integrated circuits (ICs) fabrication. Some applications include shallow trench isolation (STI), pre-metal dielectric (PMD), inter-metal dielectric (IMD) and interlayer dielectric (ILD). All of these layers require silicon dioxide films that fill features of various sizes and have uniform film thicknesses across the wafer.

Chemical vapor deposition (CVD) has traditionally been the method of choice for depositing conformal silicon dioxide films. However, as design rules continue to shrink, the aspect ratios (depth to width) of features increase, and traditional CVD techniques can no longer provide adequately conformal films in these high aspect ratio features. In addition, some gap fill techniques for high aspect ratio features may use spin-on dielectric and/or flowable oxide to deposit silicon dioxide films, but such films may not have adequate quality and density.

Conformally deposited oxide films may serve as an alternative to CVD and deposit high quality films in high aspect ratio gaps with a much higher density than spin-on dielectric and flowable oxide. Examples of conformal deposition techniques include atomic layer deposition (ALD). While ALD can be useful to form conformal oxide films, conventional ALD processes are apt to result in areas of low density forming in the films. The conformal nature of ALD processes means that the aspect ratios of the gaps increase with successive cycles. Diffusion limitations prevent precursor materials from reaching the bottom of these high aspect ratio gaps. Hence, the top of a gap may fill with silicon oxide more quickly than the bottom, preventing further diffusion of the precursor materials into the gap. As a result, areas of low density form. These areas can expand such that voids and seams may form in the middle of high aspect ratio gaps. Voids and seams may lead to high resistance, contamination, loss of filled materials, and otherwise degrade performance of ICs. Voids and seams ultimately may cause device failure.

SUMMARY

Provided is a method of conformally depositing a dielectric oxide in high aspect ratio gaps in a substrate. The method comprises providing a substrate with one or more gaps into a reaction chamber, where each gap has a depth to width aspect ratio of greater than about 5:1; depositing a first dielectric oxide layer in the one or more gaps via conformal film deposition (CFD); etching a portion of the first dielectric oxide layer using a plasma etch, where etching the portion of the first dielectric oxide layer occurs at a faster rate near a top surface than near a bottom surface of each gap so that the first dielectric oxide layer has a tapered profile from the top surface to the bottom surface of each gap; and depositing a second dielectric oxide layer in the one or more gaps over the first dielectric oxide layer via CFD.

In some embodiments, the method can further include repeating the steps of depositing, etching, and depositing to substantially fill the one or more gaps. In some embodiments, depositing the second dielectric oxide layer can substantially fill the one or more gaps. In some embodiments, the method can further include flowing a fluorine-containing species into a remote plasma to generate a plasma-activated etchant, and flowing the plasma-activated etchant into the reaction chamber to react with the first dielectric oxide layer to perform the etch. The fluorine-containing species can include nitrogen trifluoride ($NF_3$). In some embodiments, the method can include flowing hydrogen ($H_2$) into the reaction chamber while etching the portion of the first dielectric oxide layer. The flow rate ratio of hydrogen to the fluorine-containing species can be between about 1:1 and about 5:1. In some embodiments, the first dielectric oxide layer and the second dielectric oxide layer each include silicon dioxide ($SiO_2$). In some embodiments, depositing the first dielectric oxide layer in the one or more gaps via CFD can include: introducing a first reactant in vapor phase into the reaction chamber under conditions allowing the first reactant to adsorb onto the substrate surface; introducing a second reactant in vapor phase into the reaction chamber while the first reactant is adsorbed on the substrate surface, where the second reactant is introduced without sweeping the first reactant out of the reaction chamber; and exposing the substrate surface to plasma to drive a reaction between the first and the second reactants on the substrate surface to form the first dielectric oxide layer.

Provided is a method of etching a conformally deposited layer of dielectric material in a substrate. The method includes providing a substrate into a reaction chamber, where the substrate includes a gap lined with a conformal layer of dielectric material, and exposing the substrate in the reaction chamber to a plasma generated from a process gas including a fluorine-containing species and hydrogen, where the flow rate ratio of the hydrogen to the fluorine-containing species is between about 1:1 and about 5:1.

In some embodiments, exposing the substrate in the reaction chamber to a plasma includes non-conformally etching the conformal layer of dielectric material.

Provided is an apparatus for conformally depositing a dielectric oxide in high aspect ratio gaps in a substrate. The apparatus includes a reaction chamber and a plasma source coupled to the reaction chamber. The apparatus also includes a controller comprising instructions for performing the following operations: providing a substrate into the reaction chamber, wherein the substrate comprises one or more gaps, each gap having a depth to width aspect ratio of greater than about 5:1; depositing a first dielectric oxide layer in the one or more gaps via conformal film deposition (CFD); etching a portion of the first dielectric oxide layer using a plasma etch, where etching the portion of the first dielectric oxide layer occurs at a faster rate near a top surface than near a bottom surface of each gap so that the first dielectric oxide layer has a tapered profile from the top surface to the bottom surface of each gap; and depositing a second dielectric oxide layer in the one or more gaps over the first dielectric oxide layer via CFD.

In some embodiments, the controller can further comprise instructions to repeat the depositing, etching, and depositing steps to substantially fill the one or more gaps. In some embodiments, the controller comprises instructions for depositing the second dielectric oxide layer comprises instructions for substantially filling the one or more gaps. In some embodiments, the controller can further comprise instructions for flowing hydrogen ($H_2$) into the reaction chamber while etching the portion of the first dielectric oxide layer.

DETAILED DESCRIPTION

Figure 1:
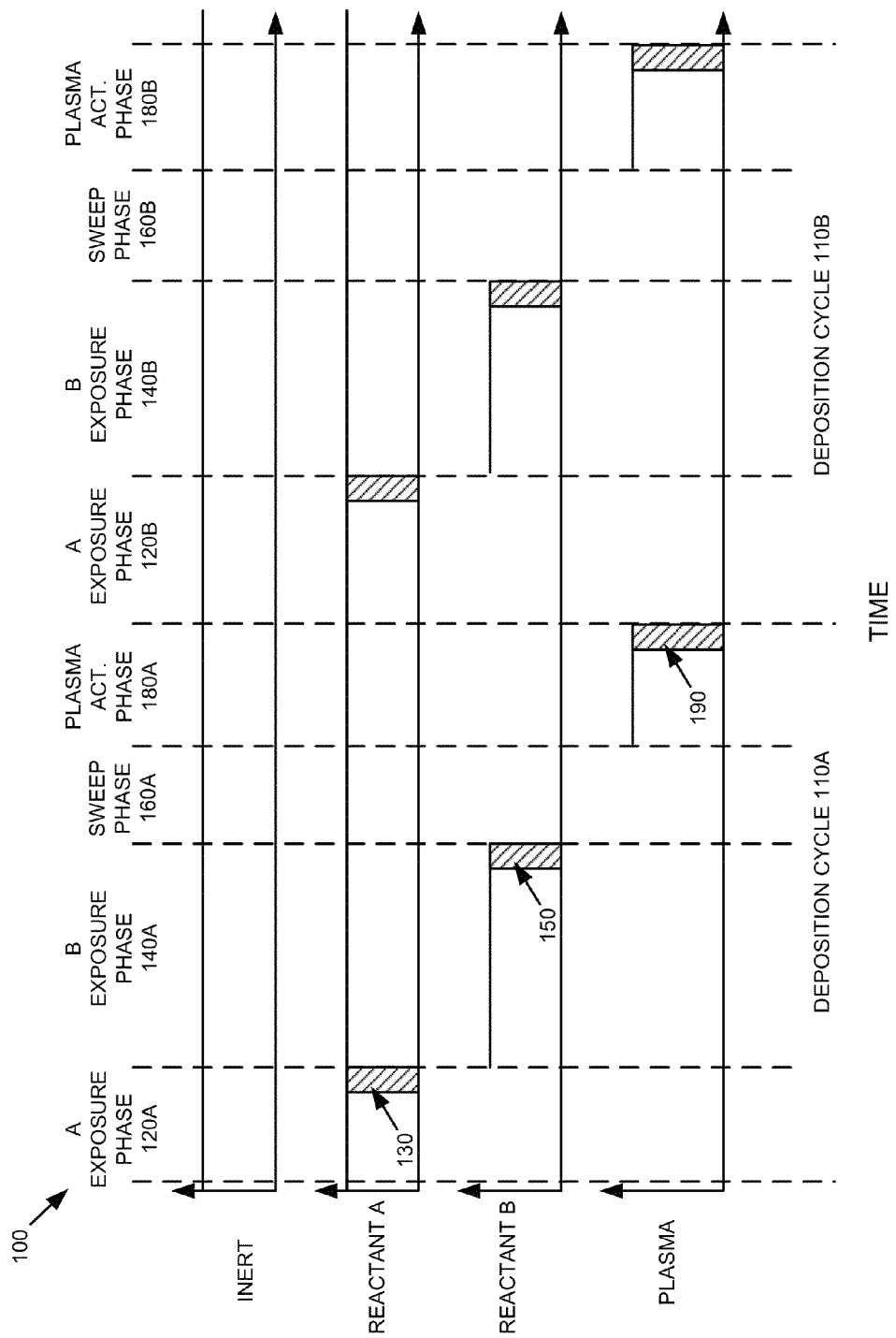
FIG. 1 shows a temporal progression of exemplary phases in a conformal film deposition (CFD) process.

In the following description, numerous specific details are set forth in order to provide a thorough understanding of the presented concepts. The presented concepts may be practiced without some or all of these specific details. In other instances, well known process operations have not been described in detail so as to not unnecessarily obscure the described concepts. While some concepts will be described in conjunction with the specific embodiments, it will be understood that these embodiments are not intended to be limiting.

The present disclosure provides methods of forming conformal films for gap fill. The methods combine the conformal film deposition techniques with a non-conformal etch technique to eliminate voids and seams.

Process

In certain embodiments, conformal film deposition (CFD) is used to deposit oxide films. Methods for forming films using CFD are described in U.S. patent application Ser. No. 13/084,399, filed on Apr. 11, 2011, and which is incorporated by reference herein for all purposes. For context, a short description of CFD is provided.

Manufacture of semiconductor devices typically involves depositing one or more thin films on a non-planar substrate in an integrated fabrication process. In some aspects of the integrated process it may be useful to deposit conformal thin films. A conformal film can be deposited on a non-planar substrate using atomic layer deposition (ALD). In contrast with a CVD process, where thermally activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first reactant (A). Some molecules of reactant A may form a condensed phase atop the substrate surface, including chemisorbed species and physisorbed molecules of reactant A. The reactor is then evacuated to remove gas phase and physisorbed reactant A so that only chemisorbed species remain. A second film reactant (B) is then introduced to the reactor so that some molecules of reactant B adsorb to the substrate surface. Thermal energy provided to the substrate activates surface reactions between adsorbed molecules of reactants A and B, forming a film layer. Finally, the reactor is evacuated to remove reaction by-products and unreacted reactant B, ending the ALD cycle. Additional ALD cycles may be included to build film thickness. Plasma, or other energetic means, may be used in conjunction with heating, or as alternatives to heating the substrate in order to drive the reaction between reactant A and B.

Depending on the exposure time of the reactant dosing steps and the sticking coefficients of the reactants, each ALD cycle may deposit a film layer of, in one example, between one-half and three angstroms thick. Thus, ALD processes may be time consuming when depositing films more than a few nanometers thick. Further, some reactants may have long exposure times to deposit a conformal film, which may also reduce wafer throughput time.

Accordingly, various embodiments described herein include CFD to deposit oxide films for gap fill. Generally, CFD does not rely on complete purges of one or more reactants prior to reaction to form an oxide gap fill. For example, there may be one or more reactants present in the vapor phase when a plasma (or other activation energy) is struck. Accordingly, one or more of the process steps described in the ALD process may be shortened or eliminated in an example CFD process. Further, in some embodiments, plasma activation of deposition reactions may result in lower deposition temperatures than thermally-activated reactions, potentially reducing the thermal budget of an integrated process.

FIG. 1, shows a temporal progression of exemplary phases in a CFD process, 100, for various process parameters, for example, inert gas flow, reactant A, reactant B and when a plasma is struck. In FIG. 1, two deposition cycles 110A and 110B are shown. One of ordinary skill in the art would appreciate that any suitable number of deposition cycles may be included in a CFD process to deposit a desired film thickness. Example CFD process parameters include, but are not limited to, flow rates for inert and reactant species, plasma power and frequency, substrate temperature, and process station pressure.

The concept of a CFD "cycle" is relevant to the discussion of various embodiments herein. Generally a cycle is the minimum set of operations required to perform a surface deposition reaction one time. The result of one cycle is production of at least a partial film layer on a substrate surface. Typically, a CFD cycle will include only those steps necessary to deliver and adsorb each reactant to the substrate surface, and then react those adsorbed reactants to form the partial layer of film. Of course, the cycle may include certain ancillary steps such as sweeping one of the reactants or byproducts and/or treating the partial film as deposited. Generally, a cycle contains only one instance of a unique sequence of operations. As an example, a cycle may include the following operations: (i) delivery/adsorption of reactant A, (ii) delivery/adsorption of reactant B, (iii) sweep B out of the reaction chamber, and (iv) apply plasma to drive a surface reaction of A and B to form the partial film layer on the surface.

Referring to FIG. 1, an inert gas is flowed during all phases of process 100. At reactant A exposure phase, 120A, reactant A is supplied at a controlled flow rate to a process station to saturate exposed surfaces of a substrate. Reactant A may be any suitable deposition reactant, for example, a nitrogen-containing or an oxygen-containing reactant. In the embodiment shown in FIG. 1, reactant A flows continuously throughout deposition cycles 110A and 110B. Unlike a typical ALD process, where film precursor (reactant) exposures are separated to prevent gas phase reaction, reactants A and B may be allowed to mingle in the gas phase of some embodiments of a CFD process. Continuously supplying reactant A to the process station may reduce or eliminate a reactant A flow rate turn-on and stabilization time compared to an ALD process where reactant A is first turned on, then stabilized and exposed to the substrate, then turned off, and finally removed from a reactor. While the embodiment shown in FIG. 1 depicts reactant A exposure phase 120A as having a constant flow rate, it will be appreciated that any suitable flow of reactant A, including a variable flow, may be employed within the scope of the present disclosure. In some embodiments, reactant A exposure phase 120A may have a duration that exceeds a substrate surface saturation time for reactant A. For example, the embodiment of FIG. 1 includes a reactant A post-saturation exposure time 130 in reactant A exposure phase 120A. Optionally, reactant A exposure phase 120A may include a controlled flow rate of an inert gas. Example inert gases include, but are not limited to, nitrogen, argon, and helium. The inert gas may be provided to assist with pressure and/or temperature control of the process station, evaporation of a liquid reactant, more rapid delivery of the reactant and/or as a sweep gas for removing process gases from the process station and/or process station plumbing.

At reactant B exposure phase 140A of the embodiment shown in FIG. 1, reactant B is supplied at a controlled flow rate to the process station to saturate the exposed substrate surface. In one example of a silicon dioxide film, reactant B may be a silicon-containing reactant such as bis(tert-butylamino)silane (BTBAS). While the embodiment of FIG. 1 depicts reactant B exposure phase 140A as having a constant flow rate, it will be appreciated that any suitable flow of reactant B, including a variable flow, may be employed within the scope of the present disclosure. Further, it will be appreciated that reactant B exposure phase 140A may have any suitable duration. In some embodiments, reactant B exposure phase 140A may have a duration exceeding a substrate surface saturation time for reactant B. For example, the embodiment shown in FIG. 1 depicts a reactant B post-saturation exposure time 150 included in reactant B exposure phase 140A.

In some embodiments, surface adsorbed B species may exist as discontinuous islands on the substrate surface, making it difficult to achieve surface saturation of reactant B. Various surface conditions may delay nucleation and saturation of reactant B on the substrate surface. For example, ligands released on adsorption of reactants A and/or B may block some surface active sites, preventing further adsorption of reactant B. Accordingly, in some embodiments, continuous adlayers of reactant B may be provided by modulating a flow of and/or discretely pulsing reactant B into the process station during reactant B exposure phase 140A. This may provide extra time for surface adsorption and desorption processes while conserving reactant B compared to a constant flow scenario. Additionally, or alternatively, in some embodiments, one or more sweep phases may be included between consecutive exposures of reactant B.

Prior to activation of the plasma, gas phase reactant B may be removed from the process station in sweep phase 160A in some embodiments. Sweeping the process station may avoid gas phase reactions where reactant B is unstable to plasma activation or where unwanted species might be formed. Further, sweeping the process station may remove surface adsorbed ligands that may otherwise remain and contaminate the film. Example sweep gases may include, but are not limited to, argon, helium, and nitrogen. In the embodiment shown in FIG. 1, sweep gas for sweep phase 160A is supplied by the continuous inert gas stream. In some embodiments, sweep phase 160A may include one or more evacuation subphases for evacuating the process station. Alternatively, it will be appreciated that sweep phase 160A may be omitted in some embodiments.

Sweep phase 160A may have any suitable duration. In some embodiments, increasing a flow rate of a one or more sweep gases may decrease the duration of sweep phase 160A. For example, a sweep gas flow rate may be adjusted according to various reactant thermodynamic characteristics and/or geometric characteristics of the process station and/or process station plumbing for modifying the duration of sweep phase 160A. In one non-limiting example, the duration of a sweep phase may be optimized by adjustment of the sweep gas flow rate. This may reduce deposition cycle time, which may improve substrate throughput.

At activation phase 180A of the embodiment shown in FIG. 1, energy is provided to activate surface reactions between surface adsorbed reactants A and B. For example, a plasma may directly or indirectly activate gas phase molecules of reactant A to form reactant A radicals. These radicals may then interact with surface adsorbed reactant B, resulting in film-forming surface reactions. In another example, ultraviolet (UV) radiation may directly or indirectly activate gas phase molecules of reactant A to form reactant A radicals, which may then interact with surface adsorbed reactant B.

According to various embodiments, activation phase 180A can include one or more of a direct (in situ) plasma, a remote plasma, UV radiation exposure, visible light radiation exposure and microwave radiation exposure. Activation phase 180A concludes deposition cycle 110A, which in the embodiment of FIG. 1 is followed by deposition cycle 110B, commencing with reactant A exposure phase 120B, and continuing with B exposure phase 140B, sweep phase 160B and plasma activation phase 180B.

In some embodiments, a plasma formed in activation phase 180A may be formed directly above the substrate surface. This may provide a greater plasma density and enhance a surface reaction rate between reactants A and B. For example, plasmas for CFD processes may be generated by applying a radio frequency (RF) field to a low-pressure gas using two capacitively coupled plates. Any suitable gas may be used to form the plasma. In this example, the inert gas such as argon or helium can be used along with reactant A, for example a nitrogen-containing or oxygen-containing reactant, to form the plasma. Ionization of the gas between the plates by the RF field ignites the plasma, creating free electrons in the plasma discharge region. These electrons are accelerated by the RF field and may collide with gas phase reactant molecules. Collision of these electrons with reactant molecules may form radical species that participate in the deposition process. It will be appreciated that the RF field may be coupled via any suitable electrodes. Non-limiting examples of electrodes include process gas distribution showerheads and substrate support pedestals. It will be appreciated that plasmas for CFD processes may be formed by one or more suitable methods other than capacitive coupling of an RF field to a gas.

In some embodiments, a plasma formed in activation phase 180A may be formed by in a remote plasma source. In some embodiments, activated species from a remote plasma source can enter the chamber housing the substrate and interact with the reactants. In some embodiments, these activated species include ions, electrons, radicals and high energy molecules. In some embodiments, the activated species that enter the chamber include radicals with substantially no ions and/or electrons, due to recombination prior to entering the chamber. An ion filter can be used in some embodiments. Examples of gases that may be fed into a remote plasma source, providing the activated species, include argon, helium, ammonia, hydrogen and oxygen.

In some embodiments, activation phase 180A can involve exposure to radiation from a UV light source. Any appropriate UV light source can be used including broadband and narrow band UV light sources. For example, radical species that participate in the deposition process may be formed by exposure to the UV radiation. In some embodiments, a UV light source may emit light of one or more wavelengths chosen to excite one or more reactants or activate a reaction. In some embodiments, UV exposure may occur when a reactant is in the reaction chamber. For example, a UV light source may be mounted within or outside the chamber. UV radiation may pass through a window to reach the reactant(s). In some other embodiments, UV exposure can occur prior to a reactant entering a chamber. For example, a reactant can be exposed to UV radiation prior to be inlet into a chamber, with radicals and/or other activated species entering the chamber. In these embodiments, activation phase 180A can be concurrent or overlap with a reactant exposure phase.

In some embodiments, activation phase 180A can involve exposure to radiation from a visible light source. For example, radical species that participate in the deposition process may be formed. In some embodiments, a visible light source may emit light of one or more wavelengths chosen to excite one or more reactants or activate a reaction. In some embodiments, visible light exposure may occur when a reactant is in the reaction chamber. For example, a light source may be mounted within or outside the chamber. Visible light may pass through a window to reach the reactant(s). In some other embodiments, exposure to visible light that excites a reactant can occur prior to a reactant entering a chamber. For example, a reactant can be exposed to the radiation prior to be inlet into a chamber, with radicals and/or other activated species entering the chamber. In these embodiments, activation phase 180A can be concurrent or overlap with a reactant exposure phase.

In some embodiments, activation phase 180A can involve exposure to microwave radiation. For example, radical species that participate in the deposition process may be formed. In some embodiments, a microwave source may emit light at one or more frequencies chosen to excite one or more reactants or activate a reaction. In some embodiments, microwave exposure may occur when a reactant is in the reaction chamber. For example, a microwave source may be mounted within or outside the chamber. Microwaves may pass through a window to reach the reactant(s). In some other embodiments, exposure to microwaves that excite a reactant can occur prior to a reactant entering a chamber. For example, a reactant can be exposed to the radiation prior to be inlet into a chamber, with radicals and/or other activated species entering the chamber. In these embodiments, activation phase 180A can be concurrent or overlap with a reactant exposure phase.

In some embodiments, activation phase 180A may involve one or more of the above-described modes of activation. Activation phase 180A may have any suitable duration. In some embodiments, activation phase 180A may have a duration that exceeds a time for activated radicals to interact with all exposed substrate surfaces and adsorbates, forming a continuous film atop the substrate surface. For example, the embodiment shown in FIG. 1 includes a post-saturation exposure time 190 in activation phase 180A.

In some embodiments, extending an activation energy exposure time and/or providing a plurality of exposure phases may provide a post-reaction treatment of bulk and/or near-surface portions of the deposited film. In one embodiment, decreasing surface contamination may prepare the surface for adsorption of reactant A. For example, a silicon nitride film formed from reaction of a silicon-containing reactant and a nitrogen-containing reactant may have a surface that may resist adsorption of subsequent reactants. Treating the silicon nitride surface with a plasma or other activation energy may create hydrogen bonds for facilitating subsequent adsorption and reaction events. In addition to plasma treatments, such treatments include electromagnetic radiation treatments, thermal treatments (e.g., anneals or high temperature pulses), and the like. Any of these treatments may be performed alone or in combination with another treatment, including a plasma treatment. In a specific embodiment, the treatment involves exposing the film to UV radiation. As described below, in a specific embodiment, the method involves the application of UV radiation to a film in situ (i.e., during formation of the film) or post deposition of the film. Such treatment serves to reduce or eliminate defect structure and provide improved electrical performance.

In certain specific embodiments, a UV treatment can be coupled with a plasma treatment. These two operations can be performed concurrently or sequentially. In the sequential option, either operation can take place first. In the concurrent option, the two treatments may be provided from separate sources (e.g., an RF power source for the plasma and a lamp for the UV) or from a single source such as a helium plasma that produces UV radiation as a byproduct.

In some embodiments, film properties, such as film stress, dielectric constant, refractive index, etch rate may be adjusted by varying plasma or other activation energy parameters.

While many examples discussed herein include two reactants (A and B), it will be appreciated that any suitable number of reactants may be employed within the scope of the present disclosure. In some embodiments, a single reactant and an inert gas used to supply plasma energy for a surface reaction can be used. Alternatively, some embodiments may use multiple reactants to deposit a film. For example, in some embodiments, a silicon nitride film may be formed by reaction of a silicon-containing reactant and one or more of a nitrogen-containing reactant, or one or more silicon-containing reactants and a single nitrogen-containing reactant, or more than one of both the silicon-containing reactant and the nitrogen-containing reactant.

Certain embodiments disclosed herein pertain to CFD oxide films. Device and package applications employing CFD oxide films that can benefit from such treatment include gap fill of structures, including trench fill of shallow trench isolation (STI) structures. While the various embodiments described below relate to a gap fill application, it will be appreciated that this is merely a non-limiting, illustrative application, and that other suitable applications, utilizing other suitable film materials, may be within the scope of the present disclosure. Further, it will also be appreciated that certain embodiments described herein include ALD processes. For example, embodiments described herein include deposition in a gap by ALD followed by an etch operation as described further below.

Figure 2A:
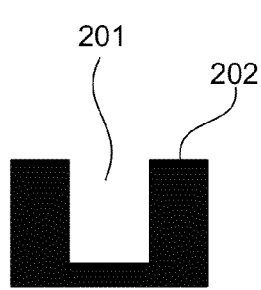
FIGS. 2A-2C are schematic cross-sectional diagrams illustrating seam/void formation during deposition of a conformal film in a gap by a conventional conformal film deposition technique.
Figure 2B:
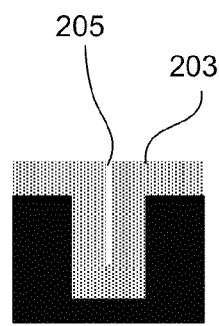
Figure 2C:
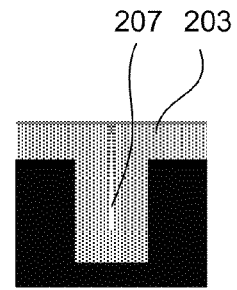

FIGS. 2A-2C are schematic cross-sectional diagrams illustrating seam/void formation during deposition of a conformal film in a trench by a conventional conformal film deposition technique. For example, FIG. 2A shows an example high aspect ratio structure 201, such as a trench, formed in a substrate 202 prior to being filled. To fill the trench, dielectric film such as a conformally deposited oxide is deposited conforming to the walls of the trench by a conventional CFD technique. FIG. 2B shows the trench after multiple cycles. As the dielectric film 203 fills the trench and fronts of the film conforming to each side advance towards each other, the trench width 205 becomes increasingly narrow. As the trench width narrows, reactants require more time to diffuse to the bottom of the trench. The diffusion limitation slows the rate of reaction at the bottom of the trench, causing the dielectric film 203 to form more quickly near the top of the trench. This causes an area of low density at the bottom of the trench. FIG. 2C shows the trench after the last CFD cycle, where a void 207 has formed. The void 207 widens towards the bottom of the trench to form a keyhole void. Keyhole voids may be re-opened and filled with conductive films in subsequent processes, which may lead to device shorting.

To reduce or eliminate the presence of voids and seams in the fill material, different types of etches can be applied between multiple successive deposition cycles. Etch chemistries can include fluorine-containing chemistries, including xenon difluoride ($XeF_2$), molecular fluorine ($F_2$), and nitrogen fluoride ($NF_3$). Other etch chemistries may include tetrafluoromethane ($CF_4$), tetrafluoroethylene ($C_2F_4$), hexafluoroethane ($C_2F_6$), octafluoropropane ($C_3F_8$), and sulfur hexafluoride ($SF_6$). In some implementations, an active fluorine-containing species can be introduced in combination with other species, such as hydrogen bromide (HBr) and/or methane (methane). In certain embodiments, the etch may be a plasma etch, such as an HDP etch. Other forms of plasma etching can include but is not limited to capacitively-coupled plasma (CCP) and inductively-coupled plasma (ICP). The plasma may be generated remotely or in the chamber. In some embodiments, $NF_3$ is fed to a remote plasma generator. Activated species, including atomic fluorine, are generated within a remote plasma generator and flowed into the chamber for the chemical etch. Still further, other chemistries may be chlorine-based.

Tapered etches can achieve selective removal of gap fill, such that more deposited material may be removed near the opening than from inside the high aspect ratio gap. In instances of high aspect ratio gaps with CVD-deposited tungsten (W), tapered etching can be achieved by supplying very little etchant of $NF_3$ into the processing chamber (e.g., use of a low etchant flow rate relative to the cavity profile and dimensions) while maintaining a high kinetic rate (e.g., high temperature) and consuming etchant along its way into the high aspect ratio gap. Thus, the concentration of etchant inside the gap is less than near the opening due to the etchant being consumed along its way into the gap. However, the use of tapered etching by the aforementioned method on CFD oxides in high aspect ratio gaps shows a conformal etch profile. Even under low temperature (e.g., about 50° C.) and high temperature (e.g., about 250° C.) regimes, the etch profile is still substantially conformal.

In addition to chemical etching, removal of top corners can be achieved by sputter etching. In sputter etching, such as used in high density plasma (HDP), corners can be removed over short distances along the sidewalls of high aspect ratio gaps. However, such etches can result in redeposition cusps that hinder gap filling.

Further, reactive ion etching (RIE) can be used to taper CFD oxide in high aspect ratio gaps, but such etch processes can be complicated. In some embodiments, the RIE etch may rely on polymer that must be subsequently cleaned in a separate step, which may require wet chemistry.

Figure 3:
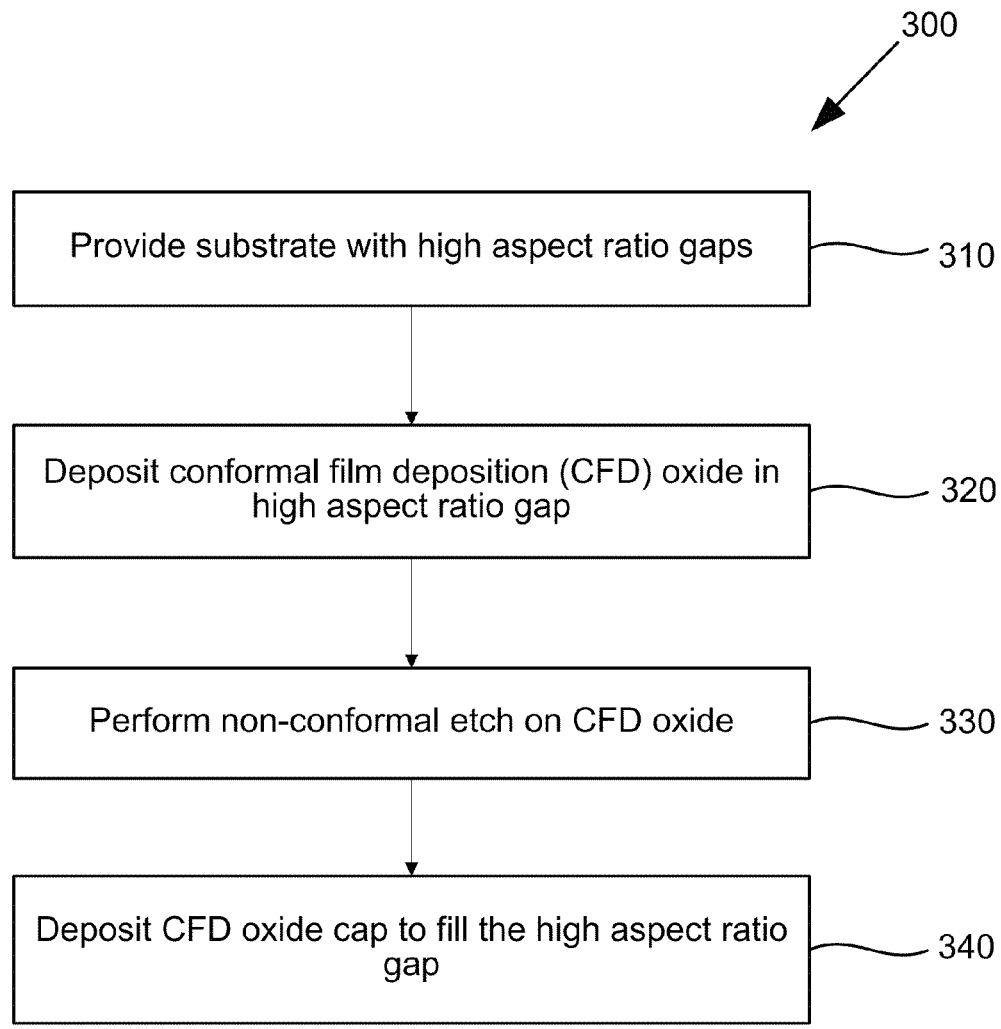
FIG. 3 shows an exemplary flow diagram illustrating a method of filling high aspect ratio gaps with a CFD oxide.

FIG. 3 shows an exemplary flow diagram illustrating a method of filling high aspect ratio gaps with a CFD oxide. FIGS. 4A-4D are schematic cross-sectional diagrams illustrating different stages of a process of filling high aspect ratio gaps with a CFD oxide. Each of the blocks 310, 320, 330, and 340 in FIG. 3 may correspond to the schematic diagrams in FIGS. 4A, 4B, 4C, and 4D, respectively.

Figure 4A:
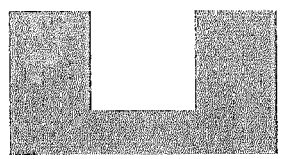
FIGS. 4A-4D are schematic cross-sectional diagrams illustrating different stages of a process of filling high aspect ratio gaps with a CFD oxide.

The process 300 can begin in block 310 where a substrate is provided with high aspect ratio gaps. FIG. 4A shows an example of a substrate with a high aspect ratio gap. The substrate can be a semiconductor substrate as used in the production of ICs. The gap width can vary according to various embodiments, which may range from about 10 Å to about 10 microns, or more particularly from about 100 Å to about 1 micron. Exemplary depth to width aspect ratios can be between about 2:1-30:1, 2:1-10:1, or 5:1-10:1. In some implementations, prior to depositing a CFD oxide, backfilled structures (not shown) such as thin films of silicon nitride (SiN) can be deposited in the gap.

Figure 4B:
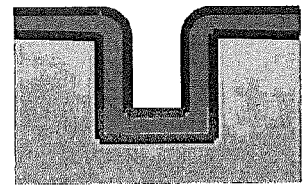

The process 300 continues in block 320 where a CFD oxide is deposited in the high aspect ratio gap, which can be illustrated in the example in FIG. 4B. The CFD oxide can be deposited using CFD techniques as discussed earlier herein with respect to FIG. 1. In some embodiments, the CFD oxide can be CFD silicon dioxide. The thickness of the CFD oxide can vary according to certain embodiments, which may range between about 10 Å to about 1000 Å, such as between about 100 Å to about 500 Å.

To deposit a CFD oxide such as a CFD silicon dioxide film, the substrate surface may be exposed to a silicon-containing precursor. Any suitable silicon-containing precursor may be used, such as selected from the group consisting of a silane, a halosilane, an aminosilane, and mixtures thereof. In one embodiment, the silicon-containing precursor is a halosilane, such as a chlorosilane. In some embodiments, the silicon-containing precursor is an aminosilane, such as tris(dimethylamino)silane (TDMAS) or bis(tertiary-butylamino)silane (BTBAS).

Other gases may be introduced to react with the silicon-containing precursor. To deposit a CFD silicon dioxide film, such gases can include an oxygen source. Examples of oxygen sources include $O_2$, $O_3$, $H_2O_2$, $NO_2$, $N_2O_3$, $N_2O_5$, or $HNO_3$. The oxygen source may be an oxygen plasma. A carrier gas may also be used. Typically, the carrier gas is an inert gas.

Any suitable number of deposition cycles may be used to achieve the desired thickness. The suitable process conditions for depositing CFD silicon dioxide may be achieved by tuning CFD parameters, including but not limited to, flow rates for inert and reactant species, plasma power and frequency, substrate temperature, and pressure.

Figure 4C:
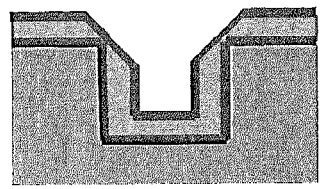

The process 300 continues in block 330 where a non-conformal etch is performed on the CFD oxide. FIG. 4C shows an example of a fluorine-based non-conformal etch on the CFD oxide creating a taper around the top of the gap. The tapered etch selectively removes more CFD oxide material near the top of the gap than CFD oxide material inside and near the bottom of the gap.

For the purposes of this description, "near the opening" or "near the top of the gap" is defined as an approximate position or an area within the feature (i.e., along the side wall of the feature) corresponding to between about 0-10% of the feature depth measured from the field region. In certain embodiments, the area near the opening or near the top of the gap corresponds to the area at the opening or at the top of the gap. Further, "inside the feature" or "inside and near the bottom of the gap" is defined as an approximate position or an area within the feature corresponding to between about 20-60% of the feature depth from the field region on the top of the feature. Typically, when values for certain parameters (e.g., thicknesses) are specified "near the opening" or "inside the feature", these values represent a measurement or an average of multiple measurements taken within these positions/areas.

In certain embodiments, the fluorine-based etchant is $NF_3$. The $NF_3$ etchant may be introduced into the chamber via plasma activation to provide activated species (e.g., radicals, ions, and/or high energy molecules). However, the $NF_3$ etchant can be a radical-based etch with substantially no ions in the chamber.

The flow rate of the etchant typically depends on the size of the chamber, etching rates, etching uniformity, and other parameters. The flow rate is also selected in such a way so as to remove more CFD oxide material near the opening of the gap than near the bottom of the gap. In some embodiments, the flow rate of a fluorine-containing reactant such as $NF_3$ is less than about 2,000 sccm, less than about 1,000 sccm, or between about 100 sccm and 1,000 sccm. (While flow rates are presented for 300 mm wafers, they may scale linearly with wafer area.)

The degree of tapering in the fluorine-based non-conformal etch can be tuned by flowing varying amounts of hydrogen ($H_2$). In some embodiments, the $NF_3$ plasma etch can tune the degree of tapering by adjusting the $H_2$ flow. Introducing $H_2$ flow can capture isotropically etching F radicals from the $NF_3$ plasma etch. In other words, more etchant is consumed along its way into the gap than is consumed near the opening of the gap. Other gases, such as oxygen, helium, and argon, do not react with radicals from $NF_3$, so the changes to the etch profile can be substantially a result of $H_2$. Thus, introducing $H_2$ flow creates a more tapered edge near the gap opening for a more non-conformal etch. The addition of $H_2$ can also reduce the overall $NF_3$ etch rate, which can be useful in controlling very small etch amounts. In some embodiments, the ratio of $H_2$ to $NF_3$ can between about 5:1-1:1, 3:1-1:1, or 3:1-1.5:1. FIGS. 6B-6D illustrate the effects of adjusting the levels of $H_2$ flow relative to $NF_3$ and the degree of tapering. The flow of $H_2$ with $NF_3$ is not as a carrier gas.

A non-limiting list of reagents and process conditions is listed in Table 1. Each of the process conditions reflected in Table 1 represents different flow rates of $H_2$ and $NF_3$ to adjust the ratio of $H_2$ to $NF_3$. As illustrated in Table 1, flowing more $H_2$ with $NF_3$ etchant may slow down the etch rate of CFD oxide.

TABLE 1

| $NF_3$ (sccm) | $H_2$ (sccm) | He (sccm) | Temp. (° C.) | Press. (mTorr) | Time to Etch 150 Å Target (s) | Etch Rate (Å/min) |
|---|---|---|---|---|---|---|
| 500 | 750 | 100 | 400 | 7 | 4.5 | 1992 |
| 250 | 750 | 100 | 400 | 7 | 11.8 | 762 |
| 250 | 375 | 100 | 400 | 7 | 7.3 | 1228 |
| 250 | 0 | 100 | 400 | 7 | 4.8 | 1885 |

At block 330 of the process 300, an etching step can include etching a conformal layer of dielectric material. The etching step can include exposing the substrate in a reaction chamber to a plasma generated from a process gas including a fluorine-containing species and $H_2$, where the flow rate ratio of the hydrogen to the fluorine-containing species is between about 1:1 and about 5:1. The fluorine-containing species can include $NF_3$. Exposing the substrate in the reaction chamber to a plasma includes non-conformally etching the conformal layer of dielectric material. A temperature in the reaction chamber can be between about 50° C. and about 150° C., such as between about 80° C. and about 120° C. A temperature of the substrate in the reaction chamber can be between about 150° C. and about 750° C., such as between about 400° C. and about 500° C. A pressure in the reaction chamber can be between 1 mTorr and about 30 mTorr, such as between about 5 mTorr and about 15 mTorr.

Figure 4D:
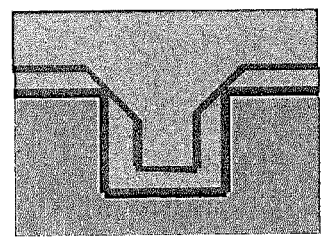

The process 300 continues in block 340 where a CFD oxide cap is deposited over the non-conformally etched CFD oxide to fill the high aspect ratio gap. FIG. 4D shows an example of the high aspect ratio gap closed by another layer of CFD oxide following the non-conformal etch. After the non-conformal etch, the reduction in average thickness of the first CFD oxide near the opening is greater than the reduction in average thickness of the first CFD oxide inside the gap, as illustrated by the example in FIG. 4C. The remaining CFD oxide layer to be deposited over the non-conformally etched CFD oxide can fill and close the gap. The deposition of the remaining CFD oxide layer can be a conformal oxide cap that creates a seam-free and void-free gap fill.

In some embodiments, the deposition-etch-deposition cycle may be repeated one or more times to fill the gap. The number of deposition-etch-deposition cycles may depend on the dimensions of the gap. Furthermore, for example, it may be difficult to achieve desirable step coverage after one cycle. Hence, another non-conformal etch may be applied following deposition of another CFD oxide film. The subsequent deposition of CFD oxide may fill or partially fill the gap, and the gap subsequently re-opened by a non-conformal etch. In certain embodiments, the process parameters for subsequent deposition-etch-deposition cycles may change. For example, the etchant flow rate may be decreased relative to the first non-conformal etch with subsequent re-opening. In some implementations, the second non-conformal etch can have a different flow rate ratio of $H_2/NF_3$ than the first non-conformal etch. Moreover, subsequent deposition may be performed at faster rates (e.g., driven by higher temperatures) since control over a deposited thickness may be less critical.

Figure 5:
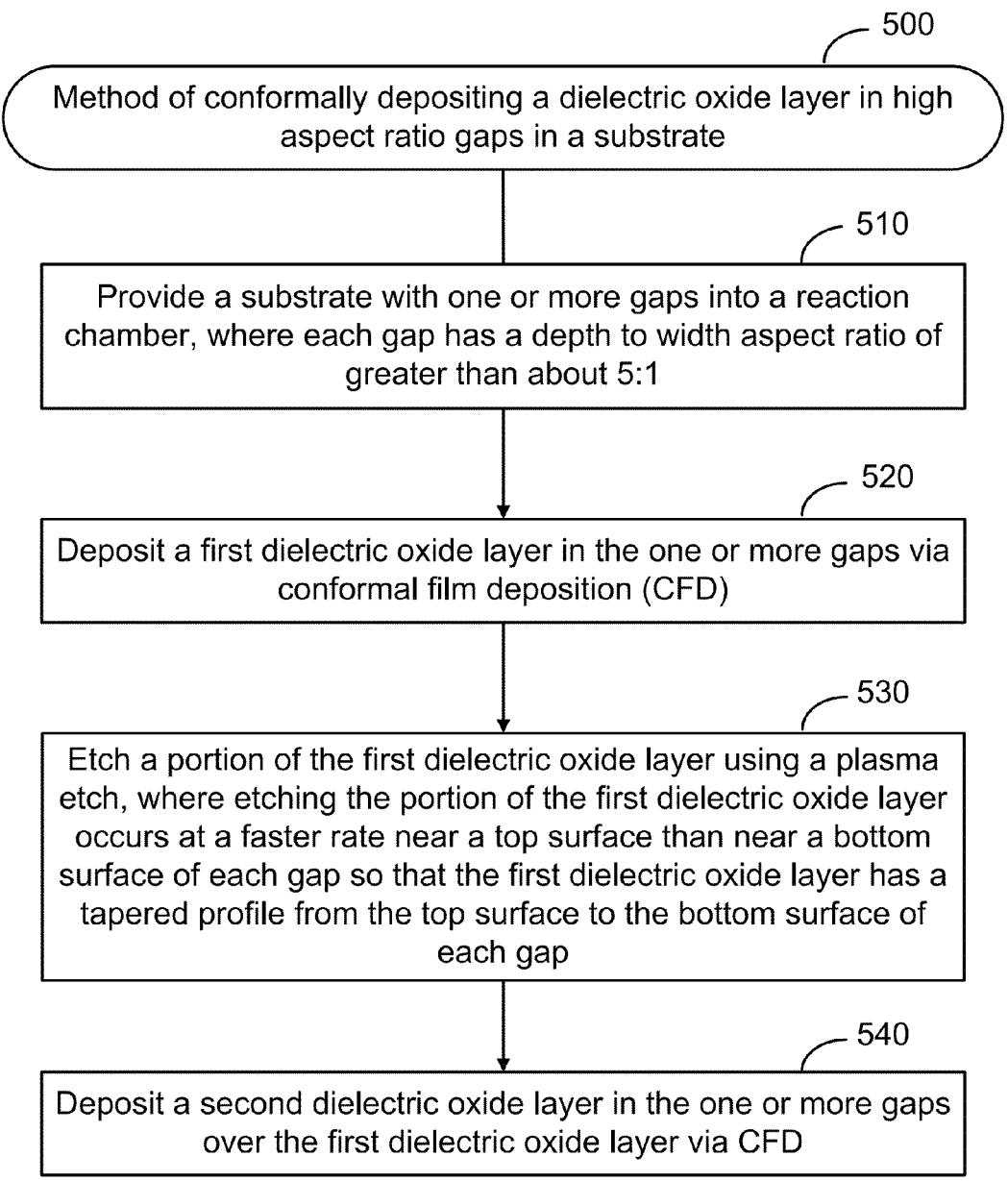
FIG. 5 shows an exemplary flow diagram illustrating a method of conformally depositing a dielectric oxide in high aspect ratio gaps in a substrate.

FIG. 5 shows an exemplary flow diagram illustrating a method of conformally depositing a dielectric oxide in high aspect ratio gaps in a substrate. Other implementations may perform the steps of the flow diagram with different, fewer, or additional steps than the ones illustrated in the flow diagram. Multiple steps can be combined in some implementations.

At block 510 of the process 500, a substrate with one or more gaps can be provided into a reaction chamber, where each gap has a depth to width aspect ratio of greater than about 5:1. The substrate can include a semiconductor substrate, a partially fabricated integrated circuit, printed circuit board, or other appropriate workpiece. Other backfilled structures, such as thin films of silicon nitride, can be deposited in the gap prior to depositing a dielectric oxide layer by CFD. In some implementations, the depth to width aspect ratios can be between about 5:1 and about 10:1. In some implementations, the one or more gaps can be part of STI structures.

At block 520 of the process 500, a first dielectric oxide layer can be deposited in the one or more gaps via CFD. The first dielectric oxide layer can be deposited using the CFD techniques discussed earlier herein with respect to FIG. 1. For example, depositing the first dielectric oxide layer in the one or more gaps can include introducing a first reactant in vapor phase into the reaction chamber under conditions allowing the first reactant to adsorb onto the substrate surface, introducing a second reactant in vapor phase into the reaction chamber while the first reactant is adsorbed on the substrate surface, where the second reactant is introduced without sweeping the first reactant out of the reaction chamber, and exposing the substrate surface to plasma to drive a reaction between the first and the second reactants on the substrate surface to form the first dielectric oxide layer.

In some implementations, the first dielectric oxide layer can include silicon dioxide. As such, the first reactant in vapor phase can include any suitable silicon-containing precursor, and the second reactant in vapor phase can include a suitable oxygen source. A carrier gas, such as an inert gas, may also be used with the silicon-containing precursor and/or oxygen source.

In some implementations, thickness of the first dielectric oxide layer can be between about 10 Å to about 1000 Å, such as between about 100 Å to about 500 Å. Any suitable number of deposition cycles via CFD may be used to achieve the desired thickness. The suitable process conditions for depositing CFD silicon dioxide may be achieved by tuning CFD parameters, including but not limited to, flow rates for inert and reactant species, plasma power and frequency, substrate temperature, and pressure.

In certain embodiments, an average thickness of the as-deposited CFD layer near the opening is at least about 10% greater than that inside the feature. In more specific embodiments, this difference may be at least 25%, at least about 50%, or at least 100%. Distribution of a material within a feature may also be characterized by its step coverage. For the purposes of this description, "step coverage" is defined as a ratio of two thicknesses, i.e., the thickness of the material inside the feature divided by the thickness of the material near the opening. In certain examples, the step coverage of the as-deposited CFD layer is less than about 100% or, more specifically, less than about 75% or even less than about 50%.

At block 530 of the process 500, a portion of the first dielectric oxide layer is etched using a plasma etch. Etching the portion of the first dielectric oxide layer occurs at a faster rate near a top surface than near a bottom surface of each gap so that the first dielectric oxide layer has a tapered profile from the top surface to the bottom surface of each gap. This type of etching can also be referred to as a "non-conformal etch."

In a non-conformal etch, more of the first dielectric oxide layer near the top surface of the gap is selectively removed than near the bottom surface of the gap. This creates a tapered profile from the top surface to the bottom surface of the gap. Such a non-conformal etch can be achieved by appropriately selecting the etch conditions with the first dielectric oxide layer deposited by CFD.

In some embodiments, the etch condition can be appropriately selected by selecting a plasma etch. The plasma may be generated remotely or in the reaction chamber. The plasma source can include ICP, HDP, CCP, etc. The plasma source can provide activated species of a gas source, including radicals, ions, and/or high energy molecules. The activated species can be directed to the first dielectric oxide layer to react with the first dielectric oxide layer.

In some embodiments, the etch condition can be appropriately selected with the appropriate etch chemistries. Etch chemistries can include a fluorine-containing species, such as $XeF_2$, $F_2$, $NF_3$, $CF_4$, $C_2F_4$, $C_2F_6$, $C_3F_8$, and $SF_6$. In some implementations, a fluorine-containing species can be flowed into a remote plasma to generate a plasma-activated etchant, and the plasma-activated etchant can be flowed into the reaction chamber to react with the first dielectric oxide layer. In some implementations, the fluorine-containing species can include $NF_3$.

In some implementations, the etch condition can further be appropriately selected by flowing $H_2$ into the reaction chamber while etching the portion of the first dielectric oxide layer. Without being limited by any theory, the presence of $H_2$ can capture radicals generated by the plasma source so that etchant can be captured. The presence of $H_2$ can consume more etchant along its way into the gap than near the opening of the gap. As a result, introducing $H_2$ can create a more tapered profile from a top surface to a bottom surface of the gap.

In some implementations, the etch condition can further be appropriately selected by adjusting the flow rates of $H_2$ and the etchant. The flow rates can be adjusted so that more of the first dielectric oxide layer is consumed near the opening of the gap than near the bottom of the gap. In some implementations, the flow rate of the fluorine-containing species or etchant can be less than about 2,000 sccm, less than about 1,000 sccm, or between about 100 sccm and 1,000 sccm. However, it is understood that the flow rate can depend on the size of the chamber, etching rates, etching uniformity, and other parameters. The flow rate of hydrogen can be tuned to be about equal or greater than the flow rate of the fluorine-containing species or the etchant. In some implementations, the flow rate ratio of the hydrogen to the fluorine-containing species is between about 1:1 and about 5:1.

At block 540 of the process 500, a second dielectric oxide layer is deposited in the one or more gaps over the first dielectric oxide layer via CFD. The material of the second dielectric oxide layer and the first dielectric oxide layer may be the same, such as silicon dioxide. In some implementations, the deposition of the second dielectric oxide layer substantially fills the one or more gaps. In some implementations, the steps of deposition-etch-deposition may be repeated to substantially fill the one or more gaps. The substantial filling of the one or more gaps can be relatively free of voids and seams.

Figure 6A:
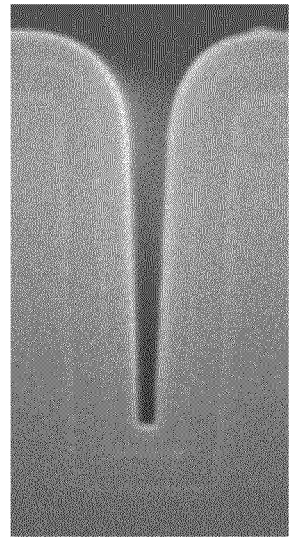
FIGS. 6A-6D are cross-sectional images of CFD oxide with tapered edges according to varying flow rate ratios of $H_2/NF_3$.
Figure 6B:
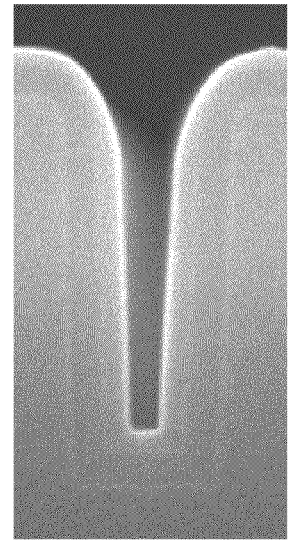
Figure 6C:
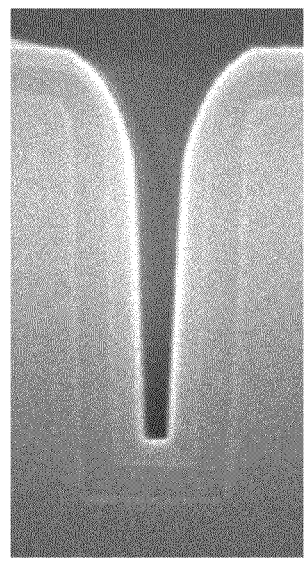
Figure 6D:
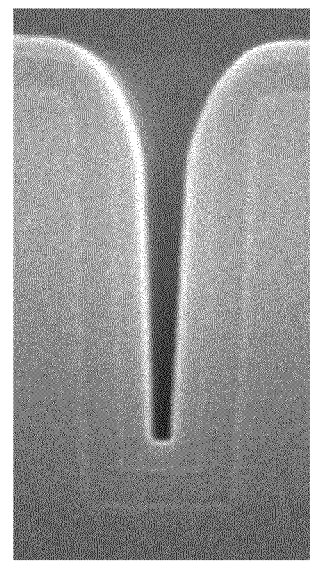

FIGS. 6A-6D are cross-sectional images of CFD oxide with tapered edges according to varying flow rate ratios of $H_2/NF_3$. FIG. 6A shows an example of a CFD oxide film deposited in a high aspect ratio gap without any etching. In the example in FIG. 6A, the CFD oxide film is a CFD silicon dioxide film with a thickness of about 300 Å. FIG. 6B shows an example of a CFD oxide film in a high aspect ratio gap etched by an $NF_3$ plasma etch without any $H_2$. As discussed earlier herein, the $NF_3$ plasma etch is substantially conformal even for adjusting between a high temperature and a low temperature regime. The $NF_3$ plasma etch targets about 150 Å removal of the CFD oxide film. In addition, with the $NF_3$ plasma etch, about 150 Å of CFD oxide film can be etched in under 15 seconds. FIG. 6C shows an example of a CFD oxide film in a high aspect ratio gap etched by an $H_2/NF_3$ plasma etch in which the flow rate ratio of $H_2$ to $NF_3$ is 1.5:1. FIG. 6D shows an example of a CFD oxide film in a high aspect ratio gap etched by an $H_2/NF_3$ plasma etch in which the flow rate ratio of $H_2$ to $NF_3$ is 3:1. In comparing the etch profiles of FIGS. 6B-6D, an increase in the flow rate ratio of $H_2$ to $NF_3$ creates a more tapered etch profile near the top of the gap opening without removing as much CFD oxide material inside the gap.

Figure 7A:
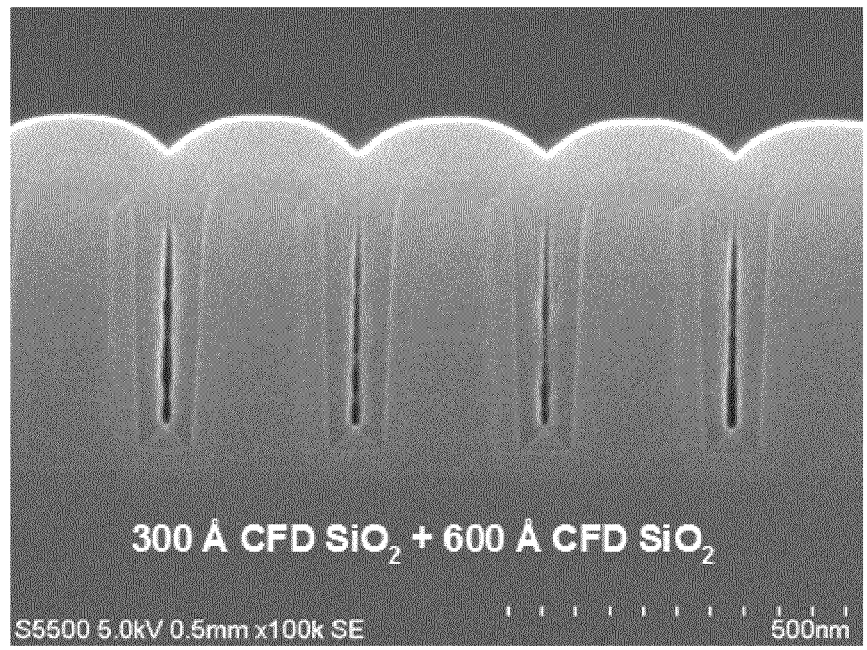
FIG. 7A is a cross-sectional image of a CFD oxide gap fill without etching between two deposition steps.

FIG. 7A is a cross-sectional image of a CFD oxide gap fill without an etch between two deposition steps. In FIG. 7A, a first layer of CFD silicon dioxide having a thickness of about 300 Å is deposited in a plurality of high aspect ratio gaps followed by a second layer of CFD silicon dioxide having a thickness of about 600 Å. The resulting gap fill in FIG. 7A creates a plurality of keyholes in each of the gap features.

Figure 7B:
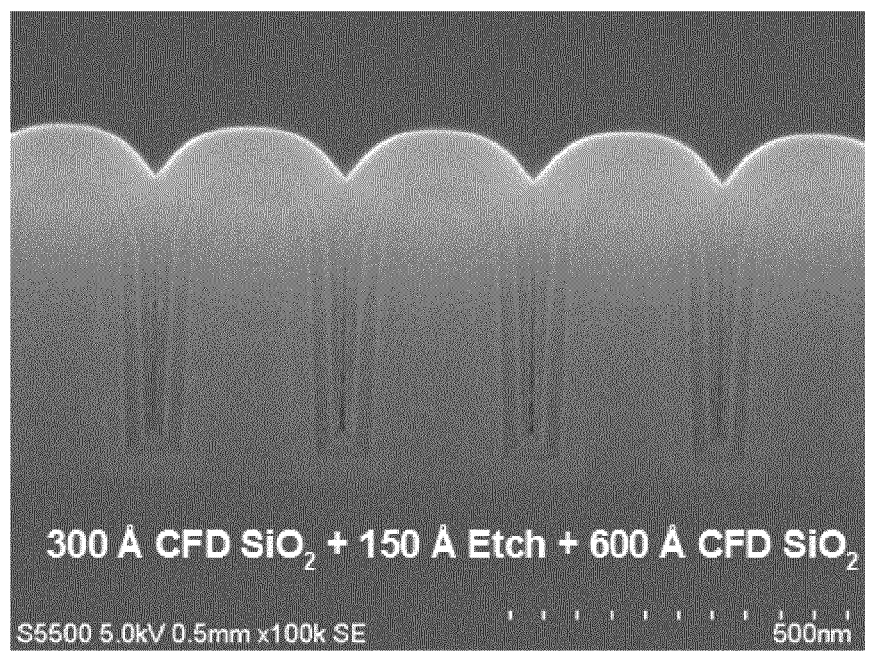
FIG. 7B is a cross-sectional image of a CFD oxide gap fill with a non-conformal etching step between two deposition steps.

FIG. 7B is a cross-sectional image of a CFD oxide gap fill with a non-conformal etch between two deposition steps. In FIG. 7B, a first layer of CFD silicon dioxide having a thickness of about 300 Å is deposited in a plurality of high aspect ratio gaps. The first layer of CFD silicon dioxide is etched non-conformally by an HDP etch with a target removal of about 150 Å. However, it is possible that the non-conformal etch to be performed using any other appropriate plasma source, such as in situ CCP, in situ ICP, or remote plasma. For example, an HDP etch can include an $NF_3$ as an etchant combined with $H_2$. The etch step is followed by deposition of a second layer of CFD silicon dioxide having a thickness of about 600 Å. The resulting gap fill in FIG. 7B reduces or eliminates the presence of keyholes and voids in each of the high aspect ratio gaps.

The deposition-etch-deposition sequence can realize a high density and high quality CFD dielectric gap fill. In some embodiments, the CFD oxide gap fill can be applied in shallow trench isolation (STI) liners. In some embodiments, the CFD oxide gap fill can be applied in pre-metal dielectrics, multiple gate field-effect transistors (FETs) such as finFET gate caps, and memory-interlevel dielectrics. It is understood that the CFD oxide gap fill can be applied in a number of dielectric gap fill applications, and the aforementioned applications are meant to be illustrative and not restrictive.

Apparatus

Another aspect of the invention is an apparatus configured to accomplish the methods described herein. A suitable apparatus includes hardware for accomplishing the process operations and a system controller having instructions for controlling process operations in accordance with the present invention.

Figure 8:
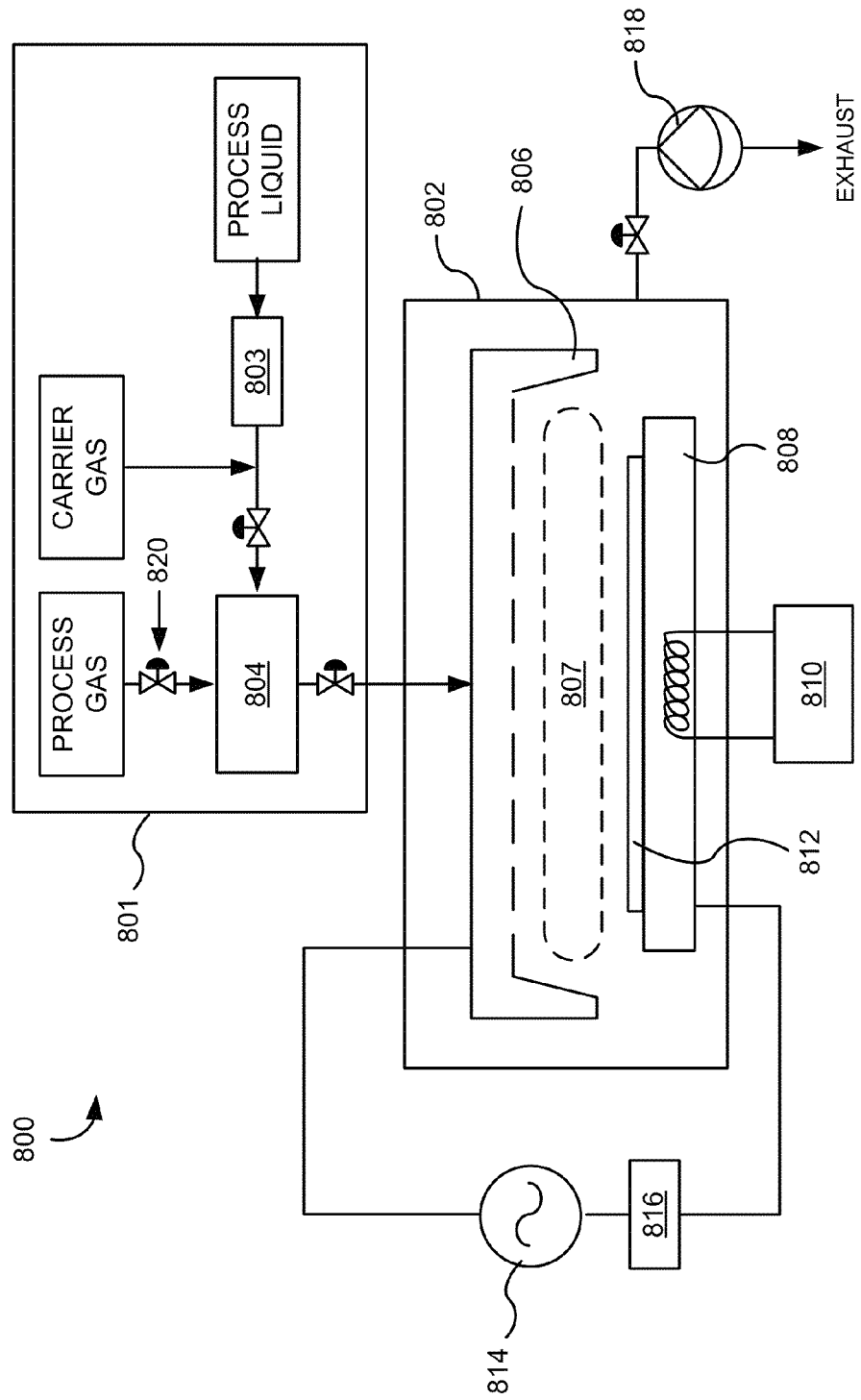
FIG. 8 illustrates an exemplary CFD processing station.
Figure 10:
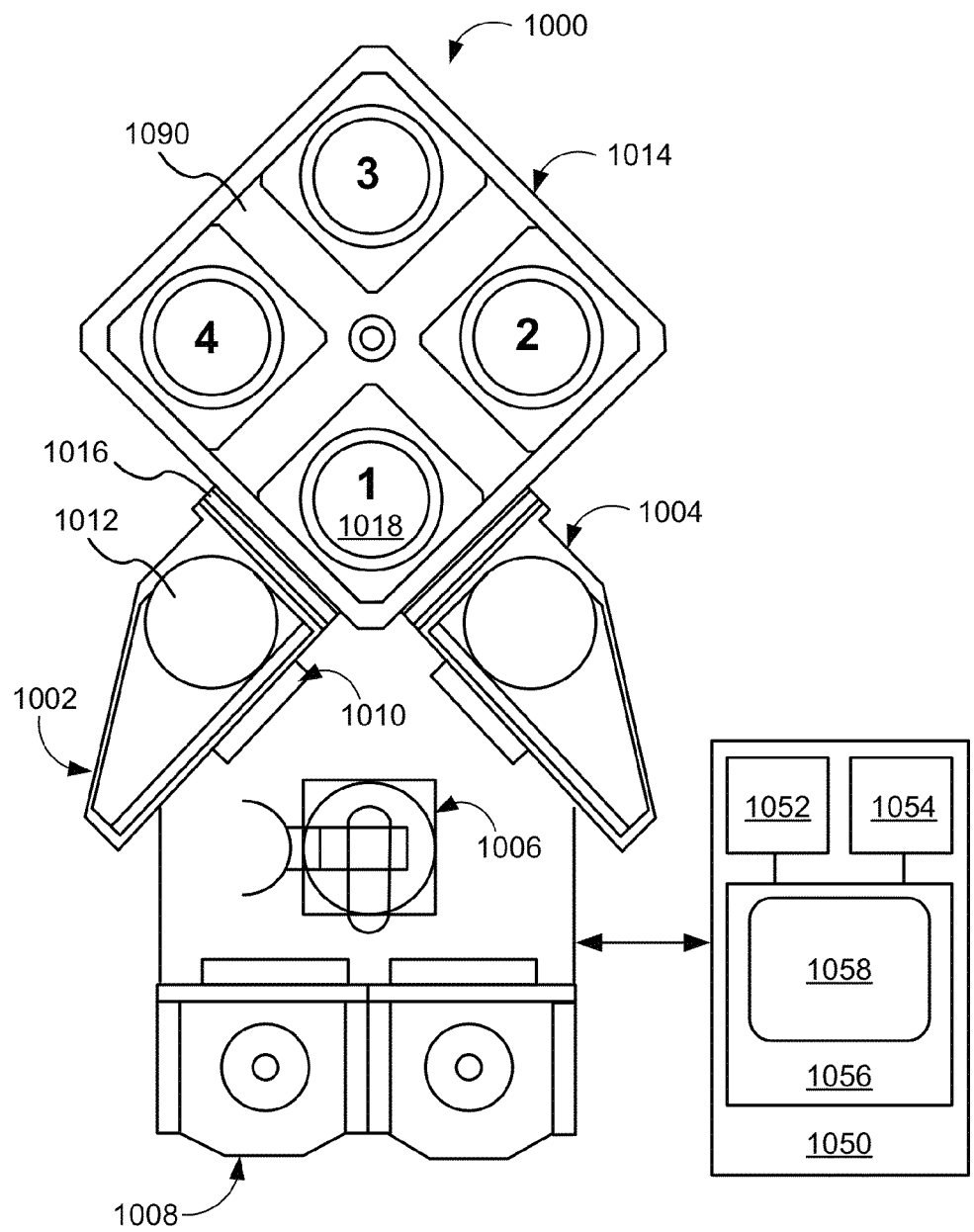
FIG. 10 illustrates a schematic view of a multi-station processing tool.

It will be appreciated that any suitable process station may be employed with one or more of the embodiments described above. For example, FIG. 8 schematically shows a CFD process station 800. For simplicity, CFD process station 800 is depicted as a standalone process station having a process chamber body 802 for maintaining a low-pressure environment. However, it will be appreciated that a plurality of CFD process stations 800 may be included in a common low-pressure process tool environment. While the embodiment depicted in FIG. 8 shows one process station, it will be appreciated that, in some embodiments, a plurality of process stations may be included in a processing tool. For example, FIG. 10 depicts an embodiment of a multi-station processing tool 1000. Further, it will be appreciated that, in some embodi-ments, one or more hardware parameters of CFD process station 800, including those discussed in detail below, may be adjusted programmatically by one or more computer controllers.

A CFD process station 800 fluidly communicates with reactant delivery system 801 for delivering process gases to a distribution showerhead 806. Reactant delivery system 801 includes a mixing vessel 804 for blending and/or conditioning process gases for delivery to showerhead 806. One or more mixing vessel inlet valves 820 may control introduction of process gases to mixing vessel 804.

Some reactants may be stored in liquid form prior to vaporization at and subsequent delivery to the process station. For example, the apparatus of FIG. 8 includes a vaporization point 803 for vaporizing liquid reactant to be supplied to mixing vessel 804. In some embodiments, vaporization point 803 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 803 is heat traced. In some examples, mixing vessel 804 is also heat traced. In one non-limiting example, piping downstream of vaporization point 803 has an increasing temperature profile extending from approximately 100° C. to approximately 150° C. at mixing vessel 804.

In some embodiments, reactant liquid is vaporized at a liquid injector. For example, a liquid injector may inject pulses of a liquid reactant into a carrier gas stream upstream of the mixing vessel. In one embodiment, a liquid injector vaporizes reactant by flashing the liquid from a higher pressure to a lower pressure. In another embodiment, a liquid injector atomizes the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 803. In one embodiment, a liquid injector is mounted directly to mixing vessel 804. In another embodiment, a liquid injector is mounted directly to showerhead 806.

In some embodiments, a liquid flow controller upstream of vaporization point 803 is provided for controlling a mass flow of liquid for vaporization and delivery to process station 800. In one example, the liquid flow controller (LFC) includes a thermal mass flow meter (MFM) located downstream of the LFC. A plunger valve of the LFC is adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC is dynamically switched between a feedback control mode and a direct control mode. In some embodiments, the LFC is dynamically switched from a feedback control mode to a direct control mode by disabling a sense tube of the LFC and the PID controller.

Showerhead 806 distributes process gases toward substrate 812. In the embodiment shown in FIG. 8, substrate 812 is located beneath showerhead 806, and is shown resting on a pedestal 808. It will be appreciated that showerhead 806 may have any suitable shape, and may have any suitable number and arrangement of ports for distributing processes gases to substrate 812.

In some embodiments, a microvolume 807 is located beneath showerhead 806. Performing a CFD process in a microvolume rather than in the entire volume of a process station may reduce reactant exposure and sweep times, may reduce times for altering CFD process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 808 may be raised or lowered to expose substrate 812 to microvolume 807 and/or to vary a volume of microvolume 807. For example, in a substrate transfer phase, pedestal 808 is lowered to allow substrate 812 to be loaded onto pedestal 808. During a CFD process phase, pedestal 808 is raised to position substrate 812 within microvolume 807. In some embodiments, microvolume 807 completely encloses substrate 812 as well as a portion of pedestal 808 to create a region of high flow impedance during a CFD process.

Optionally, pedestal 808 may be lowered and/or raised during portions the CFD process to modulate process pressure, reactant concentration, etc., within microvolume 807. In one embodiment where process chamber body 802 remains at a base pressure during the CFD process, lowering pedestal 808 allows microvolume 807 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another embodiment, adjusting a height of pedestal 808 allows a plasma density to be varied during plasma activation and/or treatment cycles included in the CFD process. At the conclusion of the CFD process phase, pedestal 808 is lowered during another substrate transfer phase to allow removal of substrate 812 from pedestal 808.

While the example microvolume variations described herein refer to a height-adjustable pedestal, it will be appreciated that, in some embodiments, a position of showerhead 806 may be adjusted relative to pedestal 808 to vary a volume of microvolume 807. Further, it will be appreciated that a vertical position of pedestal 808 and/or showerhead 806 may be varied by any suitable mechanism. One of ordinary skill in the art would appreciate that such mechanism would include, for example, hydraulics, pneumatics, spring mechanisms, solenoids and the like. In some embodiments, pedestal 808 may include a rotational mechanism, for example along an axis perpendicular to the surface of the substrate 812, for rotating an orientation of substrate 812. It will be appreciated that, in some embodiments, one or more of these example adjustments may be performed programmatically by one or more suitable computer controllers.

Returning to the embodiment shown in FIG. 8, showerhead 806 and pedestal 808 electrically communicate with RF power supply 814 and matching network 816 for powering a plasma. In some embodiments, the plasma energy is controlled by controlling one or more of a process station pressure, a gas concentration, an RF source power, an RF source frequency, and a plasma power pulse timing. For example, RF power supply 814 and matching network 816 may be operated at any suitable power to form a plasma having a desired composition of radical species. Examples of suitable powers include, but are not limited to, powers between 100 W and 5000 W. Likewise, RF power supply 814 may provide RF power of any suitable frequency. In some embodiments, RF power supply 814 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma is monitored in-situ by one or more plasma monitors. In one embodiment, plasma power is monitored by one or more voltage, current sensors (e.g., VI probes). In another embodiment, plasma density and/or process gas concentration is measured by one or more optical emission spectroscopy sensors (OES). In some embodiments, one or more plasma parameters are programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors include, but are not limited to, infrared (IR) monitors, acoustic monitors, and pressure transducers.

In some embodiments, the plasma is controlled via input/output control (IOC) sequencing instructions. For example, the instructions for setting plasma conditions for a plasma process phase may be included in a corresponding plasma activation recipe phase of a CFD process recipe. In some embodiments, process recipe phases may be sequentially arranged, so that all instructions for a CFD process phase are executed concurrently with that process phase. It will be appreciated that some aspects of plasma generation may have well-characterized transient and/or stabilization times that may prolong a plasma process phase. Put another way, such time delays may be predictable. Such time delays may include a time to strike the plasma and a time to stabilize the plasma at the indicted power setting.

In some embodiments, pedestal 808 may be temperature controlled via heater 810. Further, in some embodiments, pressure control for CFD process station 800 may be provided by butterfly valve 818. As shown in FIG. 8, butterfly valve 818 throttles a vacuum provided by a downstream vacuum pump (not shown). However, in some embodiments, pressure control of process station 800 may also be adjusted by varying a flow rate of one or more gases introduced to CFD process station 800.

Various parameters of the CFD process station 800 may be controlled by a controller (not shown). Such parameters can include but are not limited to gas composition, flow rates, chamber temperature, chamber pressure, substrate temperature, showerhead temperature, plasma conditions (such as RF bias power levels), substrate/pedestal position, showerhead position, and timing. Aspects of the controller may be described in further detail below with respect to system controller 1050 in FIG. 10.

Figure 9:
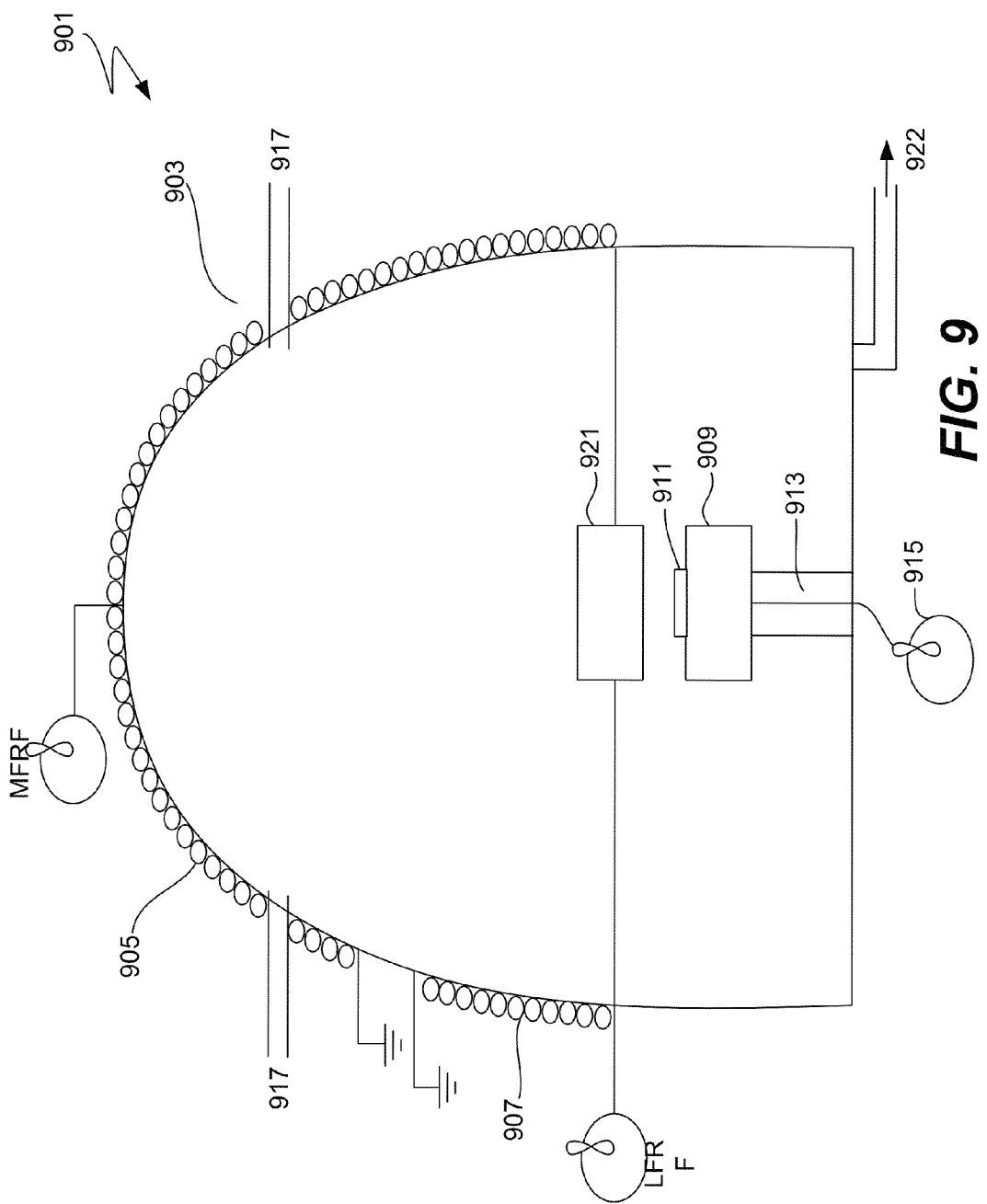
FIG. 9 illustrates an exemplary HDP processing station.

FIG. 9 illustrates an exemplary HDP processing station. As shown, a reactor 901 includes a process chamber 903 which encloses other components of the reactor 901 and serves to contain the plasma. In one example, the process chamber walls are made from aluminum, aluminum oxide, and/or other suitable materials. The embodiment shown in FIG. 9 has two plasma sources: top RF coil 905 and side RF coil 907.

Top RF coil 905 can be a medium frequency or MFRF coil and side RF coil 907 can be a low frequency or LFRF coil. In the embodiment shown in FIG. 9, MFRF frequency may be from 430-470 kHz and LFRF frequency from 340-370 kHz. However, the invention is not limited to operation in reaction chambers with dual sources, nor RF plasma sources. Any suitable plasma source or sources may be used.

Within the reactor, a wafer pedestal 909 supports a substrate 911. The pedestal typically includes a chuck (sometimes referred to as a clamp) to hold the substrate in place during the deposition reaction. The chuck may be an electrostatic chuck, a mechanical chuck or various other types of chuck as are available for use in the industry and/or research. A heat transfer subsystem including a line 913 for supplying heat transfer fluid can control the temperature of the substrate 911. The wafer chuck and heat transfer fluid system can facilitate maintaining the appropriate wafer temperatures.

A high frequency RF of HFRF source 915 can serve to electrically bias substrate 911 and draw charged precursor species onto the substrate for the deposition reaction. Electrical energy from source 915 is coupled to substrate 911 via an electrode or capacitive coupling, for example. Note that the bias applied to the substrate need not be an RF bias. Other frequencies and DC bias may be used as well.

The process gases are introduced via one or more inlets 917. The gases may be premixed or not. Preferably, the process gas is introduced through a gas supply inlet mechanism including orifices. In some embodiments, at least some of the orifices orient the process gas along an axis of injection intersecting an exposed surface of the substrate at an acute angle. Further, the gas or gas mixtures may be introduced from a primary gas ring 921, which may or may not direct the gases toward the substrate surface. Injectors may be connected to the primary gas ring 921 to direct at least some of the gases or gas mixtures into the chamber 903 and toward substrate 911. Note that injectors, gas rings or other mechanisms for directing process gas toward the wafer are not critical to this invention. The sonic front caused by a process gas entering the chamber 903 will itself cause the gas to rapidly disperse in all directions—including toward the substrate 911. Process gases exit the chamber 903 via an outlet 922. A vacuum pump (e.g., a turbomolecular pump) typically draws process gases out and maintains a suitably low pressure within the reactor 901.

Various parameters of the HDP reactor 901 may be controlled by a controller (not shown). Aspects of the controller may be described in further detail below with respect to system controller 1050 in FIG. 10.

In some embodiments, one or more processes may be performed in the same chamber. For example, the non-conformal etch process may be performed in the same chamber as the CFD process. In such embodiments, the apparatus can include a CCP NF$_3$ chamber or a remote plasma NF$_3$ chamber. However, as described above, one or more process stations may be included in a multi-station processing tool. FIG. 10 shows a schematic view of a multi-station processing tool 1000, with an inbound load lock 1002 and an outbound load lock 1004, either or both of which may comprise a remote plasma source. A robot 1006, at atmospheric pressure, is configured to move wafers from a cassette loaded through a pod 1008 into inbound load lock 1002 via an atmospheric port 1010. A wafer is placed by the robot 1006 on a pedestal 1012 in the inbound load lock 1002, the atmospheric port 1010 is closed, and the load lock is pumped down. Where the inbound load lock 1002 comprises a remote plasma source, the wafer may be exposed to a remote plasma treatment in the load lock prior to being introduced into a processing chamber 1014. Further, the wafer also may be heated in the inbound load lock 1002 as well, for example, to remove moisture and adsorbed gases. Next, a chamber transport port 1016 to processing chamber 1014 is opened, and another robot (not shown) places the wafer into the reactor on a pedestal of a first station shown in the reactor for processing. While the embodiment depicted in FIG. 10 includes load locks, it will be appreciated that, in some embodiments, direct entry of a wafer into a process station may be provided.

The depicted processing chamber 1014 comprises four process stations, numbered from 1 to 4 in the embodiment shown in FIG. 10. Each station has a heated pedestal (shown at 1018 for station 1), and gas line inlets. It will be appreciated that in some embodiments, each process station may have different or multiple purposes. For example, in some embodiments, a process station may be switchable between a CFD and PECVD process mode. Additionally or alternatively, in some embodiments, processing chamber 1014 may include one or more matched pairs of CFD and PECVD process stations. While the depicted processing chamber 1014 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 10 also depicts a wafer handling system 1090 for transferring wafers within processing chamber 1014. In some embodiments, wafer handling system 1090 may transfer wafers between various process stations and/or between a process station and a load lock. It will be appreciated that any suitable wafer handling system may be employed. Non-limiting examples include wafer carousels and wafer handling robots. FIG. 10 also depicts a system controller 1050 employed to control process conditions and hardware states of process tool 1000. System controller 1050 may include one or more memory devices 1056, one or more mass storage devices 1054, and one or more processors 1052. Processor 1052 may include a CPU or computer, analog and/or digital input/output connections, stepper motor controller boards, etc.

In some embodiments, system controller 1050 controls all of the activities of process tool 1000. System controller 1050 executes system control software 1058 stored in mass storage device 1054, loaded into memory device 1056, and executed on processor 1052. System control software 1058 may include instructions for controlling the timing, mixture of gases, chamber and/or station pressure, chamber and/or station temperature, wafer temperature, target power levels, RF power levels, substrate pedestal, chuck and/or susceptor position, and other parameters of a particular process performed by process tool 1000. System control software 1058 may be configured in any suitable way. For example, various process tool component subroutines or control objects may be written to control operation of the process tool components necessary to carry out various process tool processes. System control software 1058 may be coded in any suitable computer readable programming language.

In some embodiments, system control software 1058 may include input/output control (IOC) sequencing instructions for controlling the various parameters described above. For example, each phase of a CFD process may include one or more instructions for execution by system controller 1050. The instructions for setting process conditions for a CFD process phase may be included in a corresponding CFD recipe phase. In some embodiments, the CFD recipe phases may be sequentially arranged, so that all instructions for a CFD process phase are executed concurrently with that process phase.

Other computer software and/or programs stored on mass storage device 1054 and/or memory device 1056 associated with system controller 1050 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 1018 and to control the spacing between the substrate and other parts of process tool 1000.

A process gas control program may include code for controlling gas composition and flow rates and optionally for flowing gas into one or more process stations prior to deposition in order to stabilize the pressure in the process station. A pressure control program may include code for controlling the pressure in the process station by regulating, for example, a throttle valve in the exhaust system of the process station, a gas flow into the process station, etc.

A heater control program may include code for controlling the current to a heating unit that is used to heat the substrate. Alternatively, the heater control program may control delivery of a heat transfer gas (such as helium) to the substrate.

A plasma control program may include code for setting RF power levels applied to the process electrodes in one or more process stations.

In some embodiments, there may be a user interface associated with system controller 1050. The user interface may include a display screen, graphical software displays of the apparatus and/or process conditions, and user input devices such as pointing devices, keyboards, touch screens, microphones, etc.

The computer program code for controlling the above operations can be written in any conventional computer readable programming language: for example, assembly language, C, C++, Pascal, Fortran, or others. Compiled object code or script is executed by the processor to perform the tasks identified in the program.

In some embodiments, parameters adjusted by system controller 1050 may relate to process conditions. Non-limiting examples include process gas composition and flow rates, temperature, pressure, plasma conditions (such as RF bias power levels), etc. These parameters may be provided to the user in the form of a recipe, which may be entered utilizing the user interface.

Signals for monitoring the process may be provided by analog and/or digital input connections of system controller 1050 from various process tool sensors. The signals for controlling the process may be output on the analog and digital output connections of process tool 1000. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 1050 may provide program instructions for implementing the above-described deposition and etching processes. The program instructions may control a variety of process parameters, such as DC power level, RF bias power level, pressure, temperature, etc. The instructions may control the parameters to operate in-situ deposition of film stacks according to various embodiments described herein.

The system controller 1050 will typically include one or more memory devices and one or more processors configured to execute the instructions so that the apparatus will perform a method in accordance with the present invention. Machine-readable media containing instructions for controlling process operations in accordance with the present invention may be coupled to the system controller.

In some embodiments, an apparatus for conformally depositing a dielectric oxide in high aspect ratio gaps in a substrate can be provided. The apparatus can include a reaction chamber, such as a CFD processing chamber 1014 in FIG. 10 or a process chamber body 802 in FIG. 8. The apparatus can also include a plasma source configured to generate a plasma coupled to the reaction chamber. The apparatus can further include a controller, such as the system controller 1050 in FIG. 10. The controller can include instructions for performing one or more operations, including providing a substrate into the reaction chamber, where the substrate comprises one or more gaps, each gap having a depth to width aspect ratio of greater than about 5:1, depositing a first dielectric oxide layer in the one or more gaps via CFD, etching a portion of the first dielectric oxide layer using a plasma etch, where etching the portion of the first dielectric oxide layer occurs at a faster rate near a top surface than near a bottom surface of each gap so that the first dielectric oxide layer has a tapered profile from the top surface to the bottom surface of each gap, and depositing a second dielectric oxide layer in the one or more gaps over the first dielectric oxide layer via CFD. The controller may further include instructions for performing operations as described earlier herein with respect to FIGS. 3, 4A-4D, and 5.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically includes some or all of the following operations, each operation enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above-described processes may be changed.

Other Embodiments

Although the foregoing has been described in some detail for purposes of clarity and understanding, it will be apparent that certain changes and modifications may be practiced within the scope of the appended claims. It should be noted that there are many alternative ways of implementing the processes, systems, and apparatus described. Accordingly, the described embodiments are to be considered as illustrative and not restrictive.

What is claimed is:

1. A method of conformally depositing a dielectric oxide in high aspect ratio gaps in a substrate, the method comprising:
    (a) providing a substrate with one or more gaps into a reaction chamber, wherein each gap has a depth to width aspect ratio of greater than about 5:1;
    (b) depositing a first dielectric oxide layer in the one or more gaps via conformal film deposition (CFD), wherein depositing the first dielectric oxide layer in the one or more gaps via CFD includes:
        introducing a first reactant in vapor phase into the reaction chamber under conditions allowing the first reactant to adsorb onto the substrate surface;
        introducing a second reactant in vapor phase into the reaction chamber while the first reactant is adsorbed on the substrate surface, wherein the second reactant is introduced without sweeping the first reactant out of the reaction chamber; and
        exposing the substrate surface to plasma to drive a reaction between the first and the second reactants on the substrate surface to form the first dielectric oxide layer;
    (c) etching a portion of the first dielectric oxide layer using a plasma etch, wherein etching the portion of the first dielectric oxide layer occurs at a faster rate near a top surface than near a bottom surface of each gap so that the first dielectric oxide layer has a tapered profile from the top surface to the bottom surface of each gap; and
    (d) depositing a second dielectric oxide layer in the one or more gaps over the first dielectric oxide layer via CFD.

2. The method of claim 1, further comprising:
repeating steps (b)-(d) to substantially fill the one or more gaps.

3. The method of claim 1, wherein depositing the second dielectric oxide layer includes substantially filling the one or more gaps.

4. The method of claim 1, further comprising:
    flowing a fluorine-containing species into a remote plasma to generate a plasma-activated etchant; and
    flowing the plasma-activated etchant into the reaction chamber to react with the first dielectric oxide layer to perform the etch.

5. The method of claim 4, wherein the fluorine-containing species includes nitrogen trifluoride ($NF_3$).

6. The method of claim 4, further comprising:
    flowing hydrogen ($H_2$) into the reaction chamber while etching the portion of the first dielectric oxide layer.

7. The method of claim 6, wherein a flow rate ratio of hydrogen to the fluorine-containing species is between about 1:1 and about 5:1.

8. The method of claim 1, wherein the first dielectric oxide layer and the second dielectric oxide layer each include silicon dioxide ($SiO_2$).

9. The method of claim 1, wherein a thickness of the first dielectric oxide layer is between about 100 Å and about 500 Å.

10. An apparatus for conformally depositing a dielectric oxide in high aspect ratio gaps in a substrate, the apparatus comprising:
    a reaction chamber;
    a plasma source coupled to the reaction chamber; and
    a controller comprising instructions for performing the following operations:
        (a) providing a substrate into the reaction chamber, wherein the substrate comprises one or more gaps, each gap having a depth to width aspect ratio of greater than about 5:1;
        (b) depositing a first dielectric oxide layer in the one or more gaps via conformal film deposition (CFD), wherein depositing the first dielectric oxide layer in the one or more gaps via CFD includes:
            introducing a first reactant in vapor phase into the reaction chamber under conditions allowing the first reactant to adsorb onto the substrate surface;
            introducing a second reactant in vapor phase into the reaction chamber while the first reactant is adsorbed on the substrate surface, wherein the second reactant is introduced without sweeping the first reactant out of the reaction chamber; and
            exposing the substrate surface to plasma to drive a reaction between the first and the second reactants on the substrate surface to form the first dielectric oxide layer:
        (c) etching a portion of the first dielectric oxide layer using a plasma etch, wherein etching the portion of the first dielectric oxide layer occurs at a faster rate near a top surface than near a bottom surface of each gap so that the first dielectric oxide layer has a tapered profile from the top surface to the bottom surface of each gap; and
        (d) depositing a second dielectric oxide layer in the one or more gaps over the first dielectric oxide layer via CFD.

11. The apparatus of claim 10, wherein the controller further comprises instructions to perform:
repeating steps (b)-(d) to substantially fill the one or more gaps.

12. The apparatus of claim 10, wherein the controller comprising instructions for depositing the second dielectric oxide layer comprises instructions for substantially filling the one or more gaps.

13. The apparatus of claim 10, wherein the controller further comprises instructions to perform:
    flowing a fluorine-based species into the plasma source to generate a plasma-activated etchant; and
    flowing the plasma-activated etchant into the reaction chamber to react with the first dielectric oxide layer to perform the etch.

14. The apparatus of claim 13, wherein the controller further comprises instructions to perform:
    flowing hydrogen ($H_2$) into the reaction chamber while etching the portion of the first dielectric oxide layer.

* * * * *